United States Patent
Kameshima et al.

(10) Patent No.: US 8,107,588 B2
(45) Date of Patent: Jan. 31, 2012

(54) RADIATION IMAGING APPARATUS AND METHOD OF DRIVING THE SAME, AND RADIATION IMAGING SYSTEM

(75) Inventors: Toshio Kameshima, Kumagaya (JP); Tadao Endo, Honjo (JP); Tomoyuki Yagi, Honjo (JP); Katsuro Takenaka, Honjo (JP); Keigo Yokoyama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 183 days.

(21) Appl. No.: 12/525,125

(22) PCT Filed: Jan. 29, 2008

(86) PCT No.: PCT/JP2008/051706
§ 371 (c)(1),
(2), (4) Date: Jul. 30, 2009

(87) PCT Pub. No.: WO2008/096688
PCT Pub. Date: Aug. 14, 2008

(65) Prior Publication Data
US 2010/0086102 A1   Apr. 8, 2010

(30) Foreign Application Priority Data

Feb. 6, 2007 (JP) .................................. 2007-027157
Jan. 22, 2008 (JP) .................................. 2008-011879

(51) Int. Cl.
*G01N 23/04* (2006.01)
*H05G 1/64* (2006.01)

(52) U.S. Cl. ............................................ 378/62; 378/98
(58) Field of Classification Search ................ 378/4, 19, 378/98, 98.8, 62, 108, 146, 98.6
See application file for complete search history.

(56) References Cited

U.S. PATENT DOCUMENTS

| 6,163,029 A | 12/2000 | Yamada et al. ......... 250/370.09 |
| 6,415,049 B1 | 7/2002 | Yanagita et al. ............. 382/132 |
| 6,952,015 B2 | 10/2005 | Kameshima ............. 250/370.11 |

(Continued)

FOREIGN PATENT DOCUMENTS

JP   4-168883   6/1992

(Continued)

*Primary Examiner* — Irakli Kiknadze
(74) *Attorney, Agent, or Firm* — Fitzpatrick, Cella, Harper & Scinto

(57) ABSTRACT

There is provided a radiation imaging apparatus delivering an output image with a satisfactory image quality irrespective of the dosage of the X-rays incident on the detector. The radiation imaging apparatus according to the present invention includes a detection unit for detecting as an image signal an X-ray irradiated from the an X-ray generation apparatus and penetrating through an object; a read out unit for amplifying and reading out the image signal detected by the detection unit; and a control unit for controlling at least one of the X-ray generation apparatus, the detection unit and the read out unit such that the obtained SN ratio of the image signal according to the dosage of the X-rays incident on the detector can be equal to the S/N ratio required for the image signal.

13 Claims, 19 Drawing Sheets

U.S. PATENT DOCUMENTS

| | | | |
|---|---|---|---|
| 7,227,926 B2 | 6/2007 | Kameshima et al. | 378/98.9 |
| 7,408,167 B2 | 8/2008 | Kameshima et al. | 250/370.09 |
| 7,442,939 B2 | 10/2008 | Yagi et al. | 250/370.11 |
| 7,466,345 B2 | 12/2008 | Kameshima et al. | 348/220.1 |
| 7,491,960 B2 | 2/2009 | Takenaka et al. | 250/580 |
| 7,514,690 B2 | 4/2009 | Endo et al. | 250/370.14 |
| 7,532,706 B2 | 5/2009 | Kameshima et al. | 378/98 |
| 2006/0104417 A1 | 5/2006 | Kameshima et al. | 378/98 |
| 2009/0121143 A1 | 5/2009 | Takenaka et al. | 250/369 |
| 2009/0272909 A1 | 11/2009 | Takenaka et al. | 250/370.09 |
| 2009/0294679 A1 | 12/2009 | Yagi et al. | 250/370.09 |

FOREIGN PATENT DOCUMENTS

| | | |
|---|---|---|
| JP | 8-066389 | 3/1996 |
| JP | 8-299316 | 11/1996 |
| JP | 2000-030046 | 1/2000 |
| JP | 2002-000593 | 1/2002 |
| JP | 2006-068512 | 3/2006 |
| JP | 2006-110126 | 4/2006 |

(USING DOSAGE MONITOR)

(DESIGNATING IMAGING AREA OF FLAT PANEL DETECTOR)

| Area 11 | Area 12 | Area 13 | Area 14 |
|---|---|---|---|
| Area 21 | Area 22 | Area 23 | Area 24 |
| Area 31 | Area 32 | Area 33 | Area 34 |
| Area 41 | Area 42 | Area 43 | Area 44 |

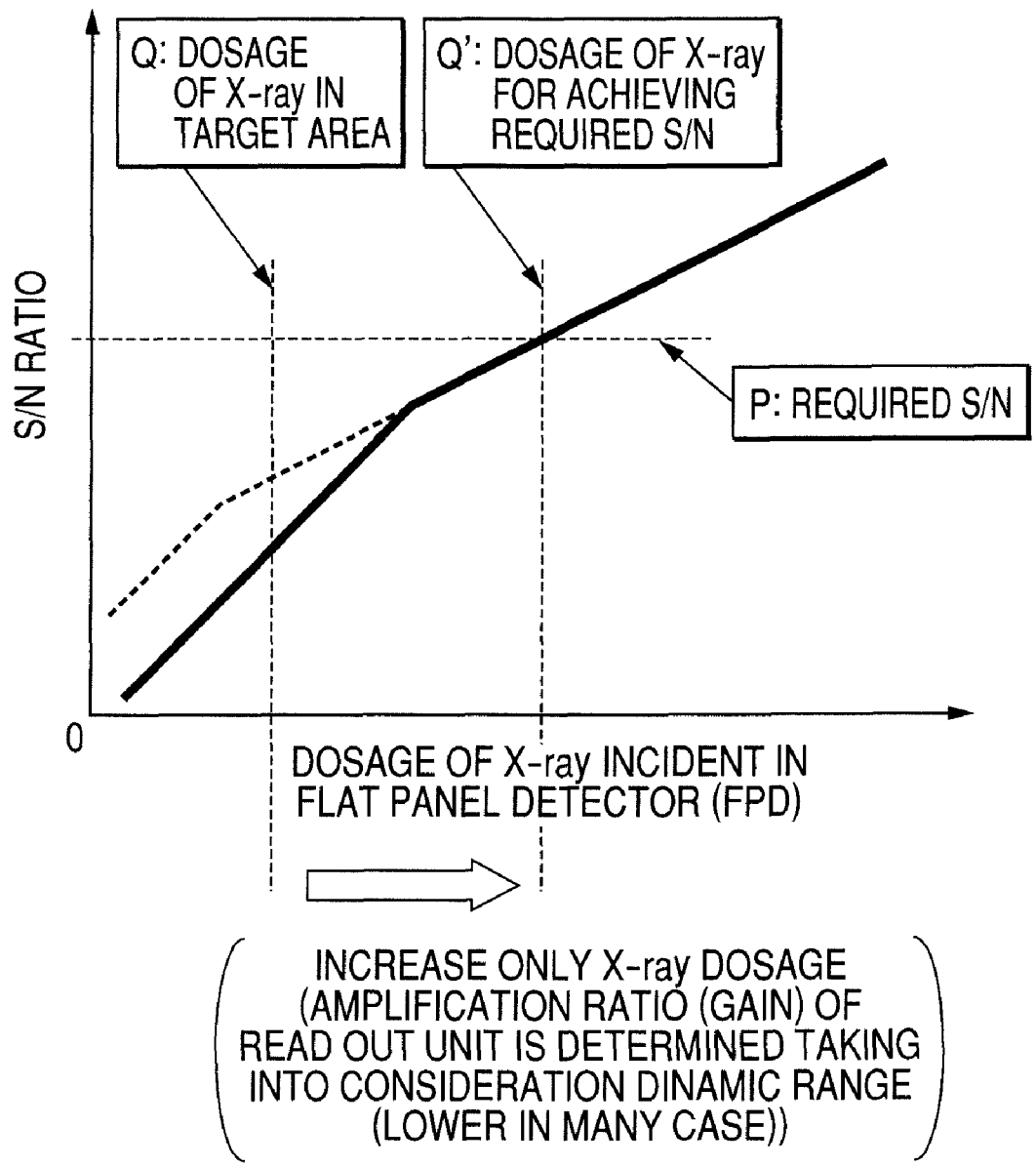

TARGET AREA DESIGNATED BY RADIOGRAPHER

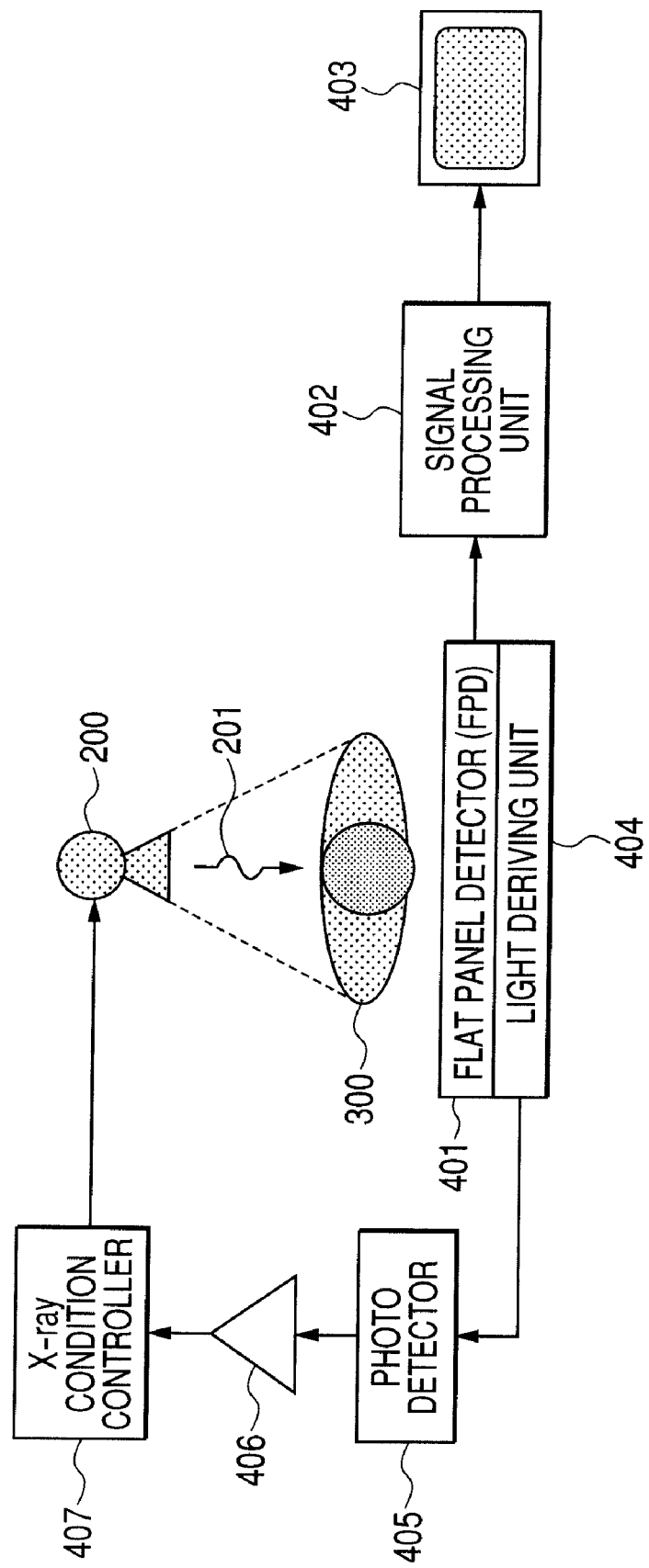

RADIATION IMAGING APPARATUS AND METHOD OF DRIVING THE SAME, AND RADIATION IMAGING SYSTEM

TECHNICAL FIELD

The present invention relates to a radiation imaging apparatus provided with a flat panel detector for detecting as an image signal a radiation emitted from a radiation generator and penetrating through an object and a method of driving the same, and a radiation imaging system provided with the radiation imaging apparatus and the radiation generator.

BACKGROUND ART

A flat panel detector has been developed in recent year which has a sensor array which uses as a material an amorphous silicon deposited and formed on an insulating substrate such as glass and has a two-dimensional arrangement of pixels composed of photoelectric conversion elements and switching elements and has been applied to a medical X-ray imaging apparatus.

The X-ray imaging apparatus using such a flat panel detector is described in Japanese Patent Application Laid-Open No. H08-299316, for example. An X-ray imaging system including a conventional X-ray imaging apparatus disclosed in Japanese Patent Application Laid-Open No. H08-299316 is described with reference to a drawing.

FIG. 20 is a schematic diagram of a conventional X-ray imaging system.

The conventional X-ray imaging system illustrated in FIG. 20 includes an X-ray generation apparatus 200, a flat panel detector 401, a signal processing unit 402, a display unit 403, a light deriving unit 404, a photo detector 405, an amplifier 406 and an X-ray condition controller 407.

In the conventional X-ray imaging system illustrated in FIG. 20, an object 300 is irradiated with X-rays 201 from the X-ray generation apparatus 200 and the X-rays 201 penetrating through the object 300 are incident on the flat panel detector (FPD) 401. An image signal detected by the flat panel detector 401 is processed in the signal processing unit 402 and then the image based on the image signal is displayed on the display unit 403.

The light deriving unit 404 detects the dosage of the X-rays penetrating through the flat panel detector 401. Information on the dosage of the X-rays detected by the light deriving unit 404 is sent to the X-ray condition controller 407 through the photo detector 405 and the amplifier 406. The X-ray condition controller 407 controls the X-ray irradiation condition of the X-ray generation apparatus 200 so that the dosage of the X-rays penetrating through the flat panel detector 401 is kept constant.

Japanese Patent Application Laid-Open No. H08-299316 describes that an image intensifier (II) and the optical system are provided instead of the flat panel detector to control the X-ray irradiation condition of the X-ray generation apparatus so that the dosage of the X-rays is kept constant, as is the case with the above.

U.S. Pat. No. 6,163,029 describes a technique that the characteristic of a processing circuit at a front stage is changed so as to fall within the dynamic range of the processing circuit at the front stage according to the X-ray irradiation condition.

DISCLOSURE OF THE INVENTION

In general, an x-ray imaging apparatus capable of fluoroscopic radiography used for operation or medical diagnosis is required to provide a less dosage of exposure of an object to radiation and an output image with a satisfactory image quality.

In Japanese Patent Application Laid-Open No. H08-299316, however, the X-ray irradiation condition of the X-ray generation apparatus is controlled so that the dosage of the X-rays incident on the detector is kept constant, for this reason, an output image with a satisfactory image quality may not be obtained depending on the dosage of the X-rays incident on the flat panel detector.

In addition, in U.S. Pat. No. 6,163,029, the characteristic of a processing circuit at a front stage is changed so as to fall within the dynamic range of the processing circuit at the front stage, this also has a problem in that an output image with a satisfactory image quality may not be obtained depending on the dosage of the X-rays incident on the flat panel detector.

The present invention has been made in view of the above problems and for its object to obtain an output image with a satisfactory image quality irrespective of the dosage of the X-rays incident on the flat panel detector.

A radiation imaging apparatus according to the present invention includes: a detection unit for detecting as an image signal a radiation emitted from a radiation generator and penetrating through an object; a read out unit for amplifying and reading out the image signal detected by the detection unit; and a control unit for controlling at least one of the radiation generator, the detection unit and the read out unit such that the image signal is derived to have S/N ratio required for the image signal; wherein the control unit adjusts a dosage of the radiation when the dosage of the radiation is within a first range in which a first noise component relating to the dosage of the radiation is dominant among noise components in the image signal, and the control unit adjusts at least one of amplification ratios of the detection unit and the read out unit when the dosage of the radiation is within a second range in which a second noise component inherent in the detection unit or the read out unit is dominant among noise components in the image signal.

A method of driving a radiation image apparatus according to the present invention includes: a detection unit for detecting as an image signal a radiation emitted from a radiation generator and penetrating through an object; and a read out unit for amplifying and reading out the image signal detected by the detection unit, the method includes the steps of: amplifying and reading out the image signal detected by the flat panel detection unit; and controlling at least one of the radiation generator, the detection unit and the read out unit such that the image signal is derived to have S/N ratio required for the image signal; wherein the controlling step includes adjusting a dosage of the radiation when the dosage of the radiation is within a first range in which a first noise component relating to the dosage of the radiation is dominant among noise components in the image signal, while adjusting at least one of amplification ratios of the detection unit and the read out unit when the dosage of the radiation is within a second range in which a second noise component inherent in the detection unit or the read out unit is dominant among noise components in the image signal.

According to the present invention, it is enabled to obtain an output image with a satisfactory image quality irrespective of the dosage of the X-rays incident on the flat panel detector.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 12 is a schematic diagram illustrating one example of a method of determining the dosage of the X-rays irradiated from an X-ray generation apparatus and an amplification ratio of the reading unit at step S105.

FIG. 20 is a schematic diagram of a conventional X-ray imaging system.

BEST MODES FOR CARRYING OUT THE INVENTION

Hereinafter, the present invention will be described with reference to the drawings in more detail. Note that, unless there is particularly described, materials, dimensions, shapes, arrangements, and the like of this embodiment do not limit the scope of the present invention. The same applies to a manufacturing method described below.

—Gist of the Present Invention—

The present inventors thought out the gist of the present invention described below to obtain an output image with a satisfactory image quality irrespective of the dosage of the X-rays incident on the flat panel detector.

The present inventors first studied a difference between S/N characteristics depending on the types of detectors for detecting X-rays as an image signal.

Figure 1:
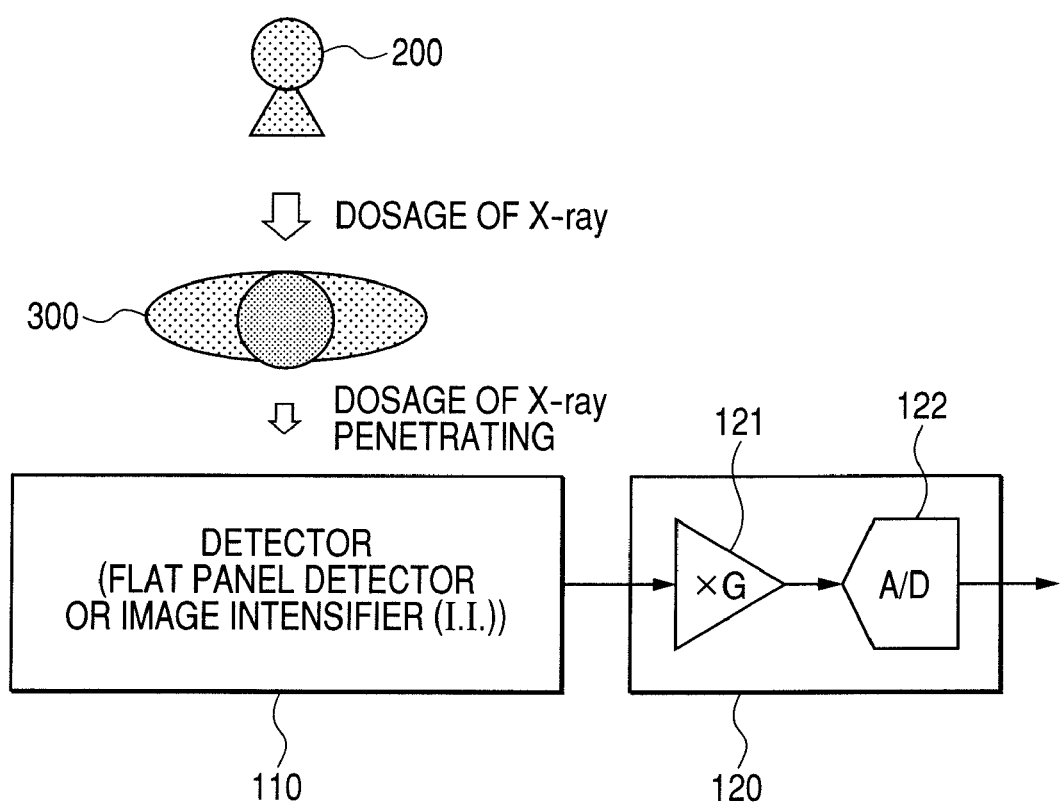
FIG. 1 is a schematic diagram of an X-ray imaging system for describing the present invention.

FIG. 1 is a schematic diagram of an X-ray imaging system for describing the present invention.

In an X-ray imaging system illustrated in FIG. 1, an object 300 is irradiated with X-rays from the X-ray generation apparatus (radiation imaging apparatus) 200 and the X-rays penetrating through the object 300 are incident on the flat panel detector 110 and detected by the flat panel detector 110 as an image signal. The image signal detected by the flat panel detector 110 is read out by a reading unit 120. A variable gain amplifier 121 in the reading unit 120 is capable of amplifying the image signal with an amplification ratio of G times, for example. The image signal amplified by the variable gain amplifier 121 is converted from an analog signal to a digital signal in an A/D converter 122 and output.

An exemplary circuit configuration inside the flat panel detector 110 and the reading unit 120 of the X-ray imaging apparatus (radiation imaging apparatus) 100 of the present invention is described below with reference to FIG. 5.

Figure 5:
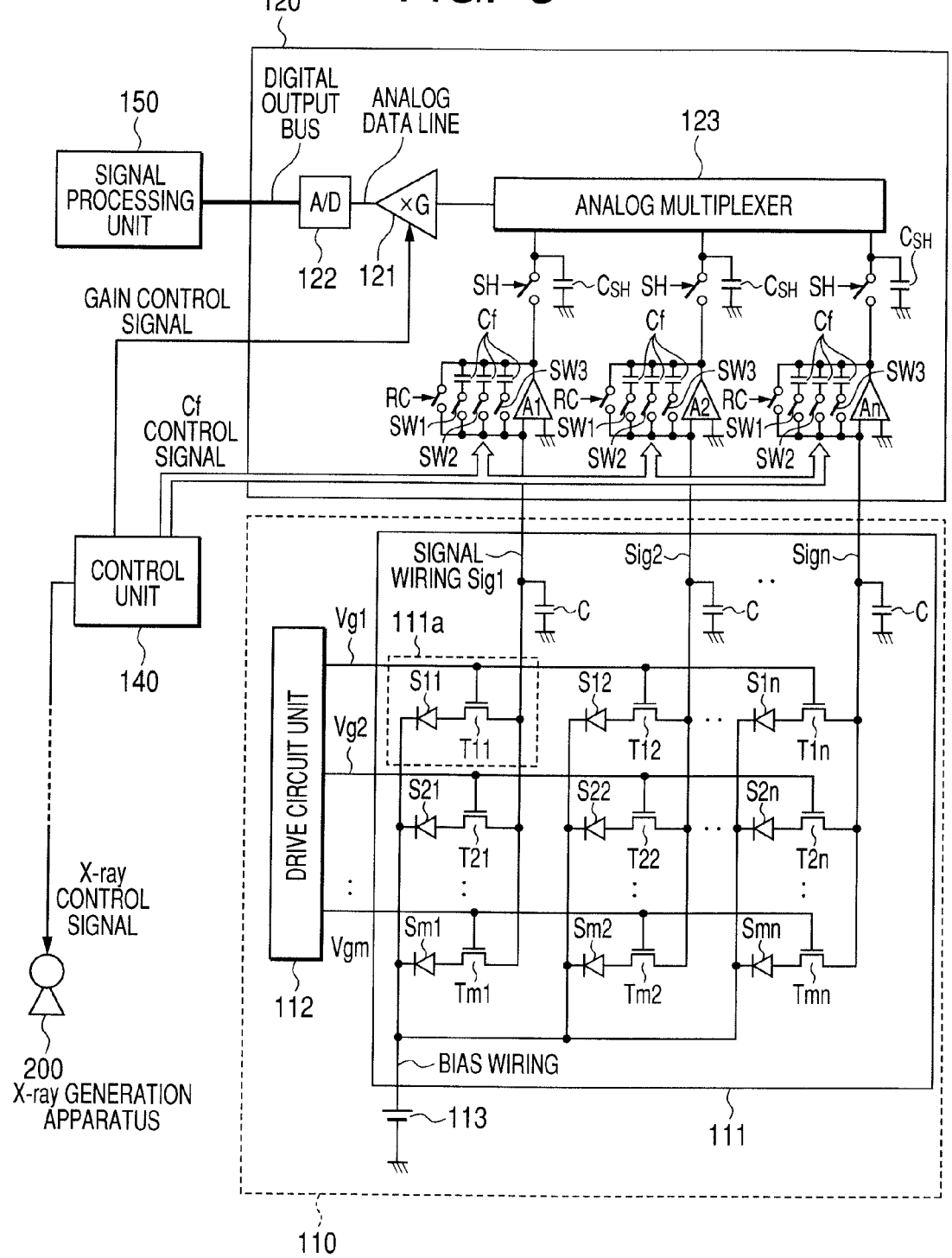
FIG. 5 is a schematic diagram of a detailed circuit configuration of a flat panel detector and a reading unit in the X-ray imaging apparatus (radiation imaging apparatus) according to the first embodiment.

As illustrated in FIG. 5, the flat panel detector 110 includes a sensor array 111, a drive circuit unit 112 and a bias (Vs) power supply 113.

The sensor array 111 is formed over a glass substrate being an insulating substrate, on which pixels 111a each including one of conversion elements (S11 to Smn) and one of switching elements (T11 to Tmn) are arranged in a two-dimensional matrix. Here, the conversion elements S11 to Smn serve to convert incident X-rays to electric signals (electric charges) and include PIN photo diodes formed of amorphous silicon and scintillators, for example. The switching elements T11 to Tmn serve to transfer the image signals based on the electric charges generated by the conversion elements S11 to Smn to the reading unit 120 and are formed of thin film transistors (TFT), for example.

A bias voltage Vs is applied to the common electrodes of the conversion elements S11 to Smn (to the cathodes of the photo diodes in FIG. 5) through a common bias line by the bias power supply 113.

The sensor array 111 is further provided with drive wirings Vg1 to Vgm for connecting the gate electrodes of the switching elements T11 to Tmn in the row direction. The drive wirings Vg1 to Vgm are connected to the drive circuit unit 112 formed of shift registers. Still furthermore, the sensor array 111 is provided with signal wirings Sig1 to Sign for connecting the source electrodes of the switching elements T11 to Tmn in the column direction. The signal wirings Sig1 to Sign are connected to the reading unit 120.

The drive circuit unit 112 supplies driving signals to the drive wirings Vg1 to Vgm to turn on the switching elements connected to the drive wirings Vg1 to Vgm to drive the switching elements.

The reading unit 120 reads out the image signals from pixels 111a through the signal wirings Sig1 to Sign. The reading unit 120 includes operational amplifiers A1 to An, feedback capacitors (integrating capacitors) Cf, sample and hold capacitors $C_{SH}$, an analog multiplexer 123, the variable gain amplifier 121 and the A/D converter 122. The reading unit 120 further includes various types of switches such as reset (RC) switches, changeover switches SW1 to SW3 for changing over the feedback capacitors Cf of the operational amplifiers A1 to An respectively and switches for sampling and holding (SH).

A control unit 140 controls the gain of the variable gain amplifier 121 in the reading unit 120 and the feedback capacitors Cf in the reading unit 120 to control the amplification ratio of the reading unit 120. In the example illustrated in FIG. 5, the feedback capacities Cf connected to the changeover switches SW1 to SW3 are equivalent to each other. The amplification of the reading unit 120 can be adjusted depending on how many of the switches SW 1 to SW3 are turned on by the control unit 140. Incidentally, in the present embodiment, the method of adjusting the amplification of the reading unit 120 is not limited to the above, for example, feedback capacitors different in capacitance from each other may be connected to the changeover switches SW1 to SW3 and only one of the changeover switches SW1 to SW3 is turned on to adjust the amplification of the reading unit 120.

As illustrated in FIG. 5, it is desirable in consideration of the bandwidth and dynamic range of the reading unit 120 that the amplification of the reading unit 120 can be controlled by a plurality of methods.

The X-ray generation apparatus 200 is configured such that the dosage of the X-rays 201 with which the object 300 is irradiated can be adjusted in response to the X-ray control signal from the control unit 140.

A noise component N for determining the S/N ratio of the X-ray imaging apparatus is described below. Noise components in the X-ray imaging apparatus illustrated in FIGS. 1 and 5 include the following two categories:

[1] X-ray quantum noise ($\sigma q$), i.e., the noise that is proportional to the square root of the quantum number N of X-rays incident on the detector (standard deviation); and

[2] System noise ($\sigma s$), i.e., the noise that is inherent in the detector or the reading unit (standard deviation).

In the present invention, the X-ray quantum noise $\sigma q$ is taken to be a first noise component being a noise component depending on the dosage of radiation and the system noise $\sigma s$ is taken to be a second noise inherent in the detector or the reading unit. Here, the system noise $\sigma s$ is described. The system noise $\sigma s$ includes plural factors: shot noise caused by the dark current of a photoelectric conversion elements (resulting from the conversion elements S11 to Smn in FIG. 5); thermal noise of the switching elements (resulting from the switching elements T11 to Tmn in FIG. 5); thermal noise of wire resistance (resulting from the signal wirings Sig1 to Sign in FIG. 5); noise in the operational amplifiers (resulting from the operational amplifiers A1 to An in FIG. 5); noise in the amplifier (resulting from the variable gain amplifier 121 in FIG. 5) and A/D quantization noise (resulting from the A/D converter 122 in FIG. 5). The present invention describes the case where the system noise $\sigma s$ does not depend on an amplification ratio. This corresponds to the case where the A/D quantization noise is dominant among the plural factors included in the system noise.

The above X-ray quantum noise [1] and the system noise [2] are independent from each other, so that a noise $\sigma_{all}$ of the entire X-ray imaging apparatus can be represented by statistics using the following mathematical formula 1:

$$\sigma_{all} = \{(\sigma q)^2 + (\sigma s)^2\}^{1/2} \quad \text{(Mathematical formula 1).}$$

When the reading unit 120 reads out image signals by multiplying the image signal of the detector 110 by amplification ratio G, the noise $\sigma_{a11}$ of the entire X-ray imaging apparatus can be represented by the following mathematical formula 2:

$$\sigma_{a11} = \{(G \cdot \sigma q)^2 + (\sigma s)^2\}^{1/2} \quad \text{(Mathematical formula 2).}$$

On the other hand, an output signal $S_{all}$ of the entire X-ray imaging apparatus can be represented by the following mathematical formula 3 irrespective of types of the detector 110:

$$S_{all} = G \cdot S \quad \text{(Mathematical formula 3),}$$

where, G is the amplification ratio of the reading unit 120 and S is the output signal of the detector 110 alone.

The S/N ratio of the entire X-ray imaging apparatus can be represented by the following mathematical formula 4:

$$\text{The S/N ratio of the entire X-ray imaging apparatus} = S_{all}/\sigma_{all} \quad \text{(Mathematical formula 4).}$$

The present inventors considered on the basis of the above a relationship between the S/N ratio characteristics of the imaging apparatus in the case where various detectors are used and the amplification ratio of the reading unit 120.

Figure 2:
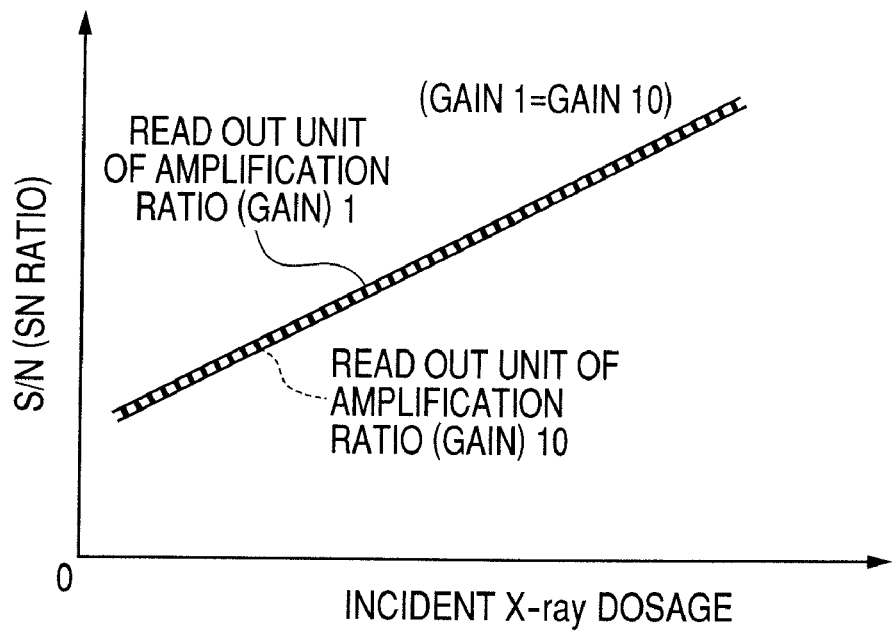
FIG. 2 is a characteristic chart illustrating a relationship between the dosage of the X-rays incident on a detector in the case of using the detector of σq>>σs and the S/N ratio of the entire X-ray imaging apparatus.
Figure 3:
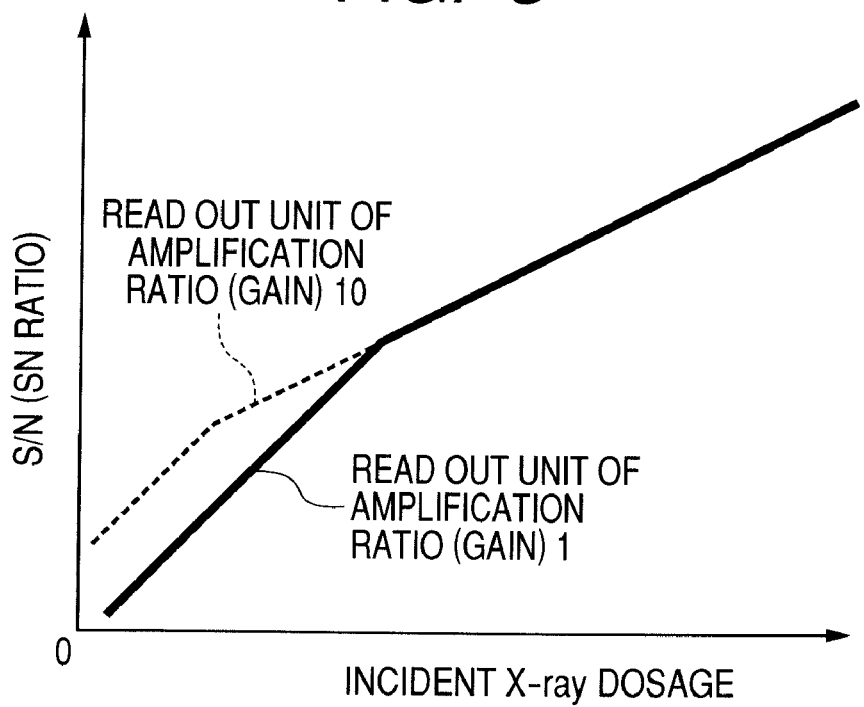
FIG. 3 is a characteristic chart illustrating a relationship between the dosage of the X-rays incident on the detector in the case of using the detector whose inherent system noise σs is comparatively high and the S/N ratio of the entire X-ray imaging apparatus.

FIG. 2 is a characteristic illustrating a relationship between the dosage of the X-rays incident on the detector with $\sigma q \gg \sigma s$ and the S/N ratio of the entire X-ray imaging apparatus. FIG. 3 is a characteristic illustrating a relationship between the dosage of the X-rays incident on the detector whose inherent system noise $\sigma s$ is comparatively high and the S/N ratio of the entire X-ray imaging apparatus. Incidentally, FIGS. 2 and 3 illustrate the characteristics with the amplification ratio (gain) of the reading unit 120 as a parameter.

(1) In the Case of Using a Detector with $\sigma q \gg \sigma s$

In this case, as illustrated in FIG. 2, a relationship in which $\sigma q \gg \sigma s$ often holds true fundamentally in all the areas of X-ray dosage. The S/N ratio has a constant inclination with respect to the incident X-ray dosage independently of the amplification ratio of the reading unit 120. That is to say, it is not effective to increase the amplification ratio of the reading unit 120 to improve the S/N ratio in this case, but it is only effective to increase the dosage of the X-rays with which the object 300 is irradiated.

(2) In the Case of Using a Flat Panel Detector Whose Inherent System Noise $\sigma s$ is Comparatively High In this case, as illustrated in FIG. 3, the S/N ratio of X-ray imaging apparatus depends on the amplification ratio of the reading unit 120 because the system noise $\sigma s$ inherent in the detector can be comparatively high. Specifically, the SN ratio can be suddenly lowered by the noise $\sigma s$ inherent in the flat panel detector in the area where the X-ray dosage is relatively low. Here, the term "the area where the X-ray dosage is relatively low" refers to such an area of the X-ray dosage where the X-ray quantum noise $\sigma q$ is smaller than the system noise $\sigma s$. The S/N ratio significantly drops owing to the system noise $\sigma s$ particularly in the area of a low X-ray dosage where the system noise $\sigma s$ is dominant over the X-ray quantum noise $\sigma q$ among the noise $\sigma_{all}$ of the entire X-ray imaging apparatus. Here, the term "the area of a low X-ray dosage" refers to such an area of the X-ray dosage where a relationship between the X-ray quantum noise $\sigma q$ and the system noise $\sigma s$ is expressed by $2\sigma q \leq \sigma s$. In such an area where that X-ray dosage is comparatively low, when the amplification ratio of the reading unit 120 is increased, the S/N ratio is improved. In particular, when the amplification ratio of the reading unit 120 is increased in the area of a low X-ray dosage, the S/N ratio is significantly improved. In an area where the X-ray dosage is comparatively high, the S/N ratio less depends on the amplification ratio of the reading unit 120. Here, the term "the area where the X-ray dosage is comparatively high" refers to an area of the X-ray dosage where the system noise $\sigma s$ is lower than the X-ray quantum noise $\sigma q$. The S/N ratio does not depend on the amplification ratio of the reading unit 120 particularly in the area of a high X-ray dosage where the X-ray quantum noise $\sigma q$ is dominant over the system noise $\sigma s$ among the noise $\sigma_{all}$ of the entire X-ray imaging apparatus. Here, the term "the area of a high X-ray dosage" refers to such an area of the X-ray dosage where a relationship between the X-ray quantum noise $\sigma q$ and the system noise $\sigma s$ is expressed by $\sigma q \geqq 2\sigma s$. That is to say, the X-ray imaging apparatus with the flat panel detector whose inherent system noise $\sigma s$ is comparatively high requires a control different from the X-ray imaging apparatus with the flat panel detector with $\sigma q \gg \sigma s$ in order to optimize the S/N ratio. Incidentally, the area of a high X-ray dosage corresponds to a first area in the present invention and the area of a low X-ray dosage corresponds to a second area in the present invention.

Then, the present inventors caused the X-ray imaging apparatus with the flat panel detector to adjust at least any one of the X-ray dosage of the X-ray generation apparatus 200 and the amplification ratio of the reading unit 120 so that the S/N ratio of the image signal can be obtained according to the incident X-ray dosage. In other words, the present inventors devised a method of controlling the X-ray dosage of the X-ray generation apparatus 200 and the amplification ratio of the reading unit 120 so that the S/N ratio of the image signal can be obtained according to the incident X-ray dosage.

For example, it is effective to increase the amplification ratio of the reading unit 120 to improve the S/N ratio in the area where the X-ray dosage incident on the flat panel detector comparatively is low. In addition, it is effective to decrease the amplification ratio of the reading unit 120 to lower the S/N ratio. That is to say, it is effective to adjust the amplification ratio of the reading unit 120 to optimize the S/N ratio in the area where the dosage of the X-rays incident on the flat panel detector is comparatively low. Particularly in the area where the X-ray dosage incident on the flat panel detector is low, it is more desirable to adjust the amplification ratio of the reading unit 120 to optimize the S/N ratio. Conversely, in the area where the incident X-ray dosage is comparatively high, it is effective to increase the dosage of the X-rays incident on the object 300 to improve the S/N ratio. It is also effective to decrease the dosage of the X-rays incident on the object 300 to decrease the S/N ratio. That is to say, it is effective to adjust the dosage of the X-rays incident on the object 300 to optimize the S/N ratio in the area where the dosage of the X-rays incident on the flat panel detector is comparatively high. Particularly in the area where the dosage of the X-rays incident on the flat panel detector is high, it is more desirable to adjust the dosage of the X-rays to optimize the S/N ratio. Incidentally, it is effective to adjust both the amplification ratio of the reading unit 120 and the dosage of the X-rays with which the object 300 is irradiated to optimize the S/N ratios in the area between the areas of a low and a high X-ray dosage respectively. Here, the area between the areas of a low and a high X-ray dosage refers to the areas where the X-ray dosage is comparatively low and high respectively and corresponds to a third area in the present invention.

—Concrete Embodiments to which the Present Invention is Applied—

Concrete embodiments are described below on the basis of the gist of the above present invention. Incidentally, although X-rays are used as a radiation in the following description of the embodiments of the present invention, the radiation is not limited to X-rays in the present invention, but includes, for example, electromagnetic waves such as visible rays, $\alpha$ rays, $\beta$ rays and $\gamma$ rays.

First Embodiment

The first embodiment of the present invention is described below with reference to the accompanied drawings.

Figure 4:
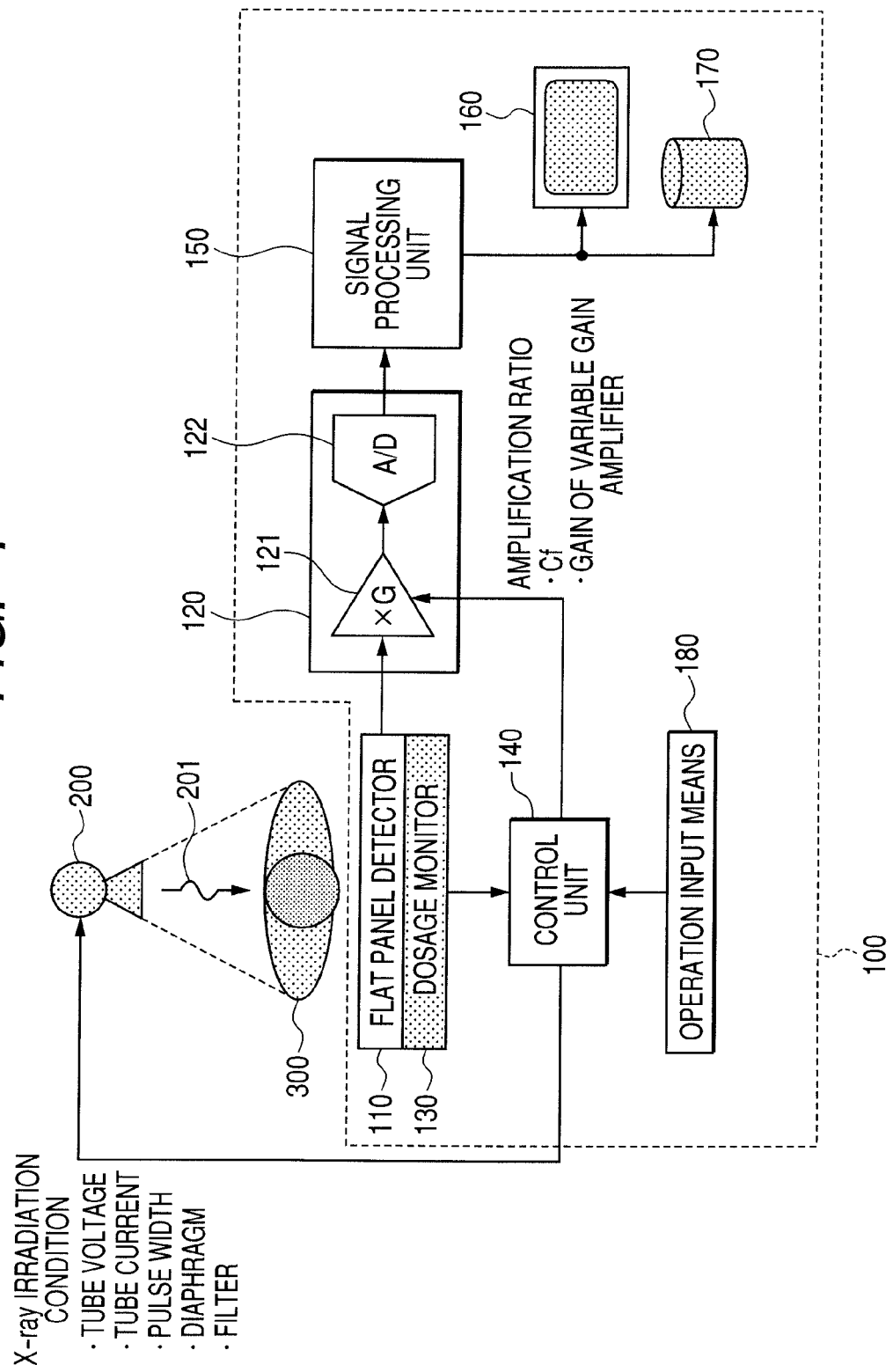
FIG. 4 is a schematic diagram of an X-ray imaging system (radiation imaging system) according to a first embodiment.

FIG. 4 is a schematic diagram of an X-ray imaging system (radiation imaging system) according to the first embodiment.

As illustrated in FIG. 4, the X-ray imaging system according to the first embodiment includes the X-ray generation apparatus 200 for irradiating the object 300 with the X-rays 201 and the X-ray imaging apparatus (radiation imaging apparatus) 100 for imaging the X-rays 201 penetrating through the object 300 as an image signal.

As illustrated in FIG. 4, the X-ray imaging apparatus 100 includes the flat panel detector 110, the reading unit 120, a dosage monitor 130, the control unit 140, a signal processing unit 150, a display unit 160, a memory unit 170 and an operation input unit 180.

The flat panel detector 110 detects the X-rays 201 irradiated from the X-ray generation apparatus 200 and penetrating through the object 300 as an image signal.

The reading unit 120 includes the variable gain amplifier 121 and the A/D converter 122. The reading unit 120 amplifies the image signal detected by the flat panel detector 110 and reads out the amplified signal. More specifically, the variable gain amplifier 121 in the reading unit 120 is capable of amplifying the image signal with an amplification ratio of G times, for example. The image signal amplified by the variable gain amplifier 121 is converted from an analog signal to a digital signal in the A/D converter 122 and output.

The dosage monitor (radiation dosage detection unit) 130 is arranged in the vicinity of the flat panel detector 110, (in FIG. 4, however, it is arranged on the other side of the flat panel detector 110) and detects (monitors) the X-ray dosage in a target area (RO1) in which a radiographer such as a doctor or an operator is interested.

The control unit 140 totally controls the operation of the X-ray imaging system and controls the operation of the composing units 110 to 130, 150 to 180 and 200 of the X-ray imaging system if required.

The control unit 140 in the present embodiment is capable of controlling the amplification ratio of the reading unit 120 and the dosage of the X-rays 201 irradiated from the X-ray generation apparatus 200 according to information on the X-ray dosage detected by the dosage monitor 130. Specifically, the control unit 140 controls the gain of the variable gain amplifier 121 in the reading unit 120 and the feedback capacitors Cf in the reading unit 120 to control the amplification ratio of the reading unit 120. Furthermore, the control unit 140 controls the X-ray irradiation conditions such as tube voltage, tube current, pulse width of the X-rays 201 irradiated, diaphragm and filter of the X-ray generation apparatus 200 to control the dosage of the X-rays 201 irradiated from the X-ray generation apparatus 200.

More specifically, the control unit 140 calculates the amplification ratio and the dosage of the X-rays 201 with which the object 300 is irradiated according to "the dosage of the X-rays incident on the flat panel detector 110" detected by the dosage monitor 130 used at the time of amplifying the image signal using a lookup table (not shown) or a calculating unit. The control unit 140 controls and adjusts at least one of the amplification ratio of the reading unit 120 and the dosage of the X-rays 201 irradiated from the X-ray generation apparatus 200 so as to satisfy the S/N ratio predetermined according to the calculated X-ray dosage thereby adjusting image quality. Incidentally, the output signal S in the present invention corresponds to any one of an average value, a minimum value and a maximum value of the output in the target area. The noise component N in the present invention corresponds to any one of the standard deviation of the output in the target area and the standard deviation of difference in the output in the target area between a plurality of frames. The S/N ratio in the present invention is a percentage of the output signal S corresponding to any one of the above values divided by the noise component N.

In the above, there has been described the method of controlling the X-ray dosage by controlling the X-ray irradiation condition of the X-ray generation apparatus 200 and the amplification ratio of the reading unit 120 so as to satisfy the predetermined S/N ratio.

In the present embodiment, the operation input unit 180 is further provided in addition to the above configuration, by which a radiographer can set S/N ratio (that is, required image quality) which the radiographer requires through, for example, the operation input unit 180. In this case, the control unit 140 controls based upon information on the X-ray dosage in the target area from the dosage monitor 130 and information on the required S/N ratio (required image quality) input from the operation input unit 180. Specifically, the control unit 140 determines the X-ray dosage by controlling the X-ray irradiation condition of the X-ray generation apparatus 200 and the amplification ratio of the reading unit 120 using a lookup table or calculating unit based upon these pieces of information to perform control.

The signal processing unit 150 includes, for example, a processor and a memory, and subjects the image signal output from the reading unit 120 to a predetermined image processing to generate image data in response to the control of the control unit 140.

The image data generated by the signal processing unit 150 is stored in the memory unit 170 in response to the control of the control unit 140 or an image based on the image data is displayed on the display unit 160.

Figure 6:
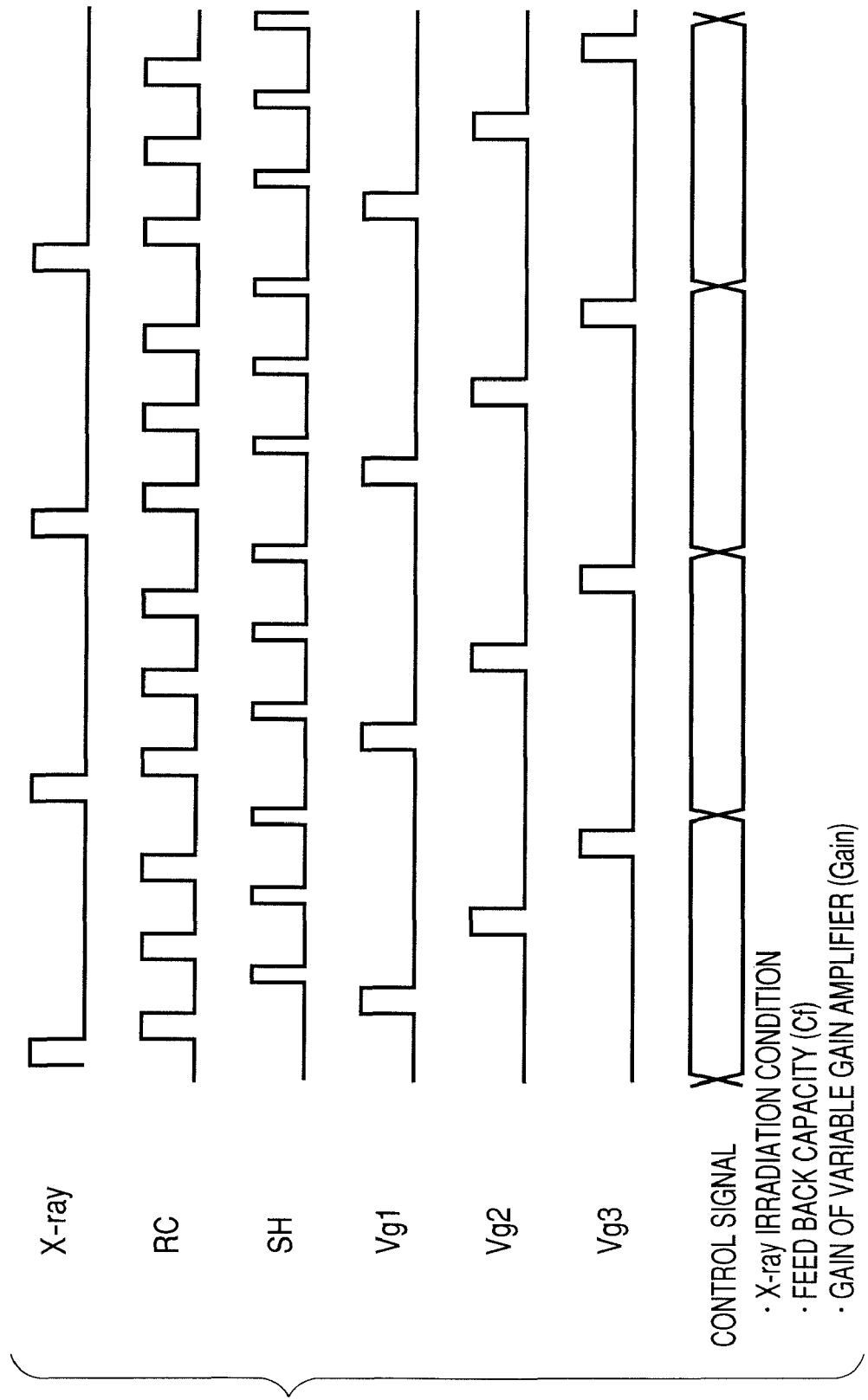
FIG. 6 is a timing chart illustrating a method of driving the X-ray imaging apparatus (radiation imaging apparatus) according to the first embodiment.

A method of driving the X-ray imaging apparatus 100 according to the first embodiment is described below. The X-ray imaging apparatus 100 according to the first embodiment uses the flat panel detector 110 and the reading unit 120 illustrated in FIG. 5. FIG. 6 is a timing chart illustrating a method of driving the X-ray imaging apparatus (radiation imaging apparatus) 100 according to the first embodiment.

The object 300 is irradiated with the X-rays 201 from the X-ray generation apparatus 200 under the predetermined X-ray irradiation condition. The X-rays penetrating through the object 300 are incident on the flat panel detector 110. A reset (RC) signal from a timing generating unit (not shown) turns on switches for reset (RC) provided on the operational amplifiers A1 to An to reset the feedback capacitors (integrating capacitors) Cf and the signal wirings Sig1 to Sign to a reference electric potential (Vref electric potential).

Subsequently, a driving signal is supplied to the drive wiring Vg1 from the drive circuit unit 112 to turn on the switching elements T11 to Tin on the first row connected to the drive wiring Vg1. This transfers the image signals based on electric potentials generated by the conversion elements S11 to S1n on the first row to the reading unit 120 through the signal wirings Sig1 to Sign. Then, the transferred image signals based on electric charge are converted to image signals based on voltage by the operational amplifiers A1 to An connected to the signal wirings Sig1 to Sign. At this point, the changeover switches SW1 to SW3 are turned on and off based on the Cf control signal from the control unit 140 to set the feedback capacitors (integrating capacitors) Cf of the operational amplifiers A1 to An to desired capacity.

When a sampling and holding (SH) signal is applied to the reading unit 120 from the timing generating apparatus (not shown), the image signals from the operational amplifiers A1 to An are sampled by the sampling and holding capacitors $C_{SH}$. Thereafter, the image signals sampled by sampling and holding capacitors $C_{SH}$ are converted to serial data by the analog multiplexer 123 and output to the variable gain amplifier 121.

The variable gain amplifier 121 amplifies the input image signal based on the gain control signal from the control unit 140 and outputs the amplified image signal to the A/D converter 122 through the analog data line. The A/D converter 122 converts the input analog image signal to a digital signal and output it to the signal processing unit 150 through a digital in synchronization to the predetermined clock output bus.

The above driving operation processes the image signals from the conversion elements S11 to S1n on the first row.

Subsequently, the reset (RC) signal from the timing generating unit (not shown) again resets the feedback capacitors (integrating capacitors) Cf of the operational amplifiers A1 to An and the signal wirings Sig1 to Sign to the reference electric potential (Vref electric potential). After that, a driving signal is supplied to the drive wiring Vg2 from the drive circuit unit 112. The image signals based on electric charges generated by conversion elements S21 to S2n on the second row are read out by the reading unit 120 through the switching elements T21 to T2n on the second row and the signal wirings Sig1 to Sign.

Similarly to the above, the image signals on the conversion elements on the second to the m-th row are subjected to the same processing as those on the conversion elements S11 to S1n on the first row, thereby the image signals of one frame, i.e., all pixels in the sensor array 111 are read out.

The dosage of the X-rays in the target area in which a radiographer is interested out of X-rays incident on the flat panel detector 110 is monitored by the dosage monitor 130 on a frame basis and input to the control unit 140. The control unit 140 calculates optimal X-ray dosage and the amplification ratio of the reading unit 120 using a lookup table (not shown) or a calculating unit from the X-ray dosage in the target area. The control unit 140 determines the X-ray irradiation condition of the X-ray generation apparatus 200, the feedback capacitors Cf of the reading unit 120 and the gain of the variable gain amplifier 121 to realize these calculations.

The control unit 140 transmits an X-ray control signal related to the determined X-ray irradiation condition to the X-ray generation apparatus 200 to set the X-ray irradiation condition in the X-ray generation apparatus 200. Similarly, the control unit 140 transmits the Cf control signal related to the determined feedback capacitors Cf to the changeover switches SW1 to SW3 to set the feedback capacitors Cf in the operational amplifiers A1 to An. The control unit 140 transmits the gain control signal related to the determined gain of the variable gain amplifier 121 to the variable gain amplifier 121 to set the gain of the variable gain amplifier 121.

Figure 7:
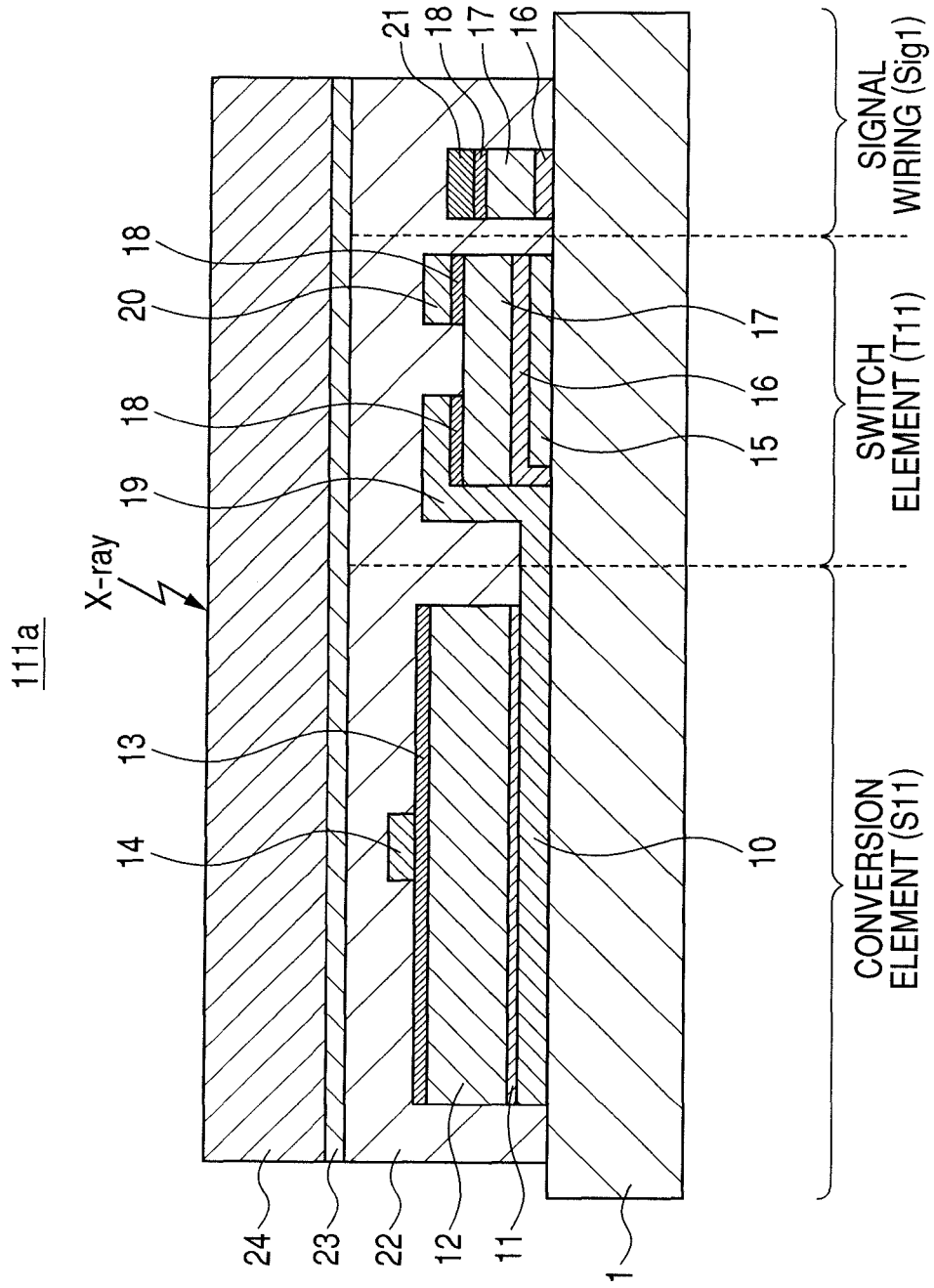
FIG. 7 is a schematic diagram illustrating a cross section of a pixel shown in FIG. 5.

The configuration of the pixel 111a illustrated in FIG. 5 is described below. FIG. 7 is a schematic diagram illustrating a cross section of the pixel 111a shown in FIG. 5. Specifically, FIG. 7 illustrates a cross configuration typified by the conversion element (S11), the switch element (T11) and the signal wiring (Sig1).

The conversion element (S11) includes a PIN photo diode (a photoelectric conversion element) and a scintillator layer 24. The PIN photo diode is configured such that a lower electrode layer 10, a p-layer 11 formed of amorphous silicon, a semiconductor layer 12 formed of amorphous silicon, an n-layer 13 formed of amorphous silicon and an upper electrode layer 14 are deposited in this order over a glass substrate 1. The conversion element (S11) is configured such that a protective layer 22, an adhesive layer 23 and a scintillator layer 24 are deposited in this order over the PIN photo diode.

The conversion element (S11) operates in such a manner that incident X-rays are converted to light (visible rays) by the scintillator layer 24 and the light converted by the scintillator layer 24 is converted to electric charges by the PIN photo diode.

The switch element (T11) is configured such that a gate electrode layer 15, an insulative layer 16 formed of amorphous silicon nitride film, a semiconductor layer 17 formed of amorphous silicon, an n-layer 18 formed of amorphous silicon, and a drain electrode layer 19/a source electrode layer 20 are deposited in this order over the glass substrate 1. Furthermore, in the switch element (T11), the protective layer 22, the adhesive layer 23 and the scintillator layer 24 are deposited in this order over the drain electrode layer 19/the source electrode layer 20.

The signal wiring (Sig1) is electrically connected to a source electrode layer 20 (not shown in FIG. 7) of the switch element (T11) as illustrated in FIG. 5. The signal wiring (Sig1) is configured such that the insulative layer 16 formed of amorphous silicon nitride film, the semiconductor layer 17 formed of amorphous silicon, the n-layer 18 formed of amorphous silicon and a wiring layer 21 are deposited in this order over the glass substrate 1. Furthermore, in the signal wiring (Sig1), the protective layer 22, the adhesive layer 23 and the scintillator layer 24 are deposited in this order over the wiring layer 21.

The lower electrode layer 10 of the conversion element (S11), the drain electrode layer 19 and the source electrode layer 20 of the switch element (T11) and the wiring layer 21 of the signal wiring (Sig1) are formed of the same metallic material at the same process.

The protective layer 22 is formed of a material such as amorphous silicon nitride film which is high in transmissivity of X-rays. The scintillator layer 24 is formed of a Gadolium-based material or a material such as cesium iodide.

Although the conversion element (S11) illustrated in FIG. 7 includes the PIN photo diode, the conversion element (S11) is not limited to this diode in the present embodiment, but it may be a MIS photodiode, for example. Although the conversion element (S11) illustrated in FIG. 7 is formed of the scintillator layer 24 and the photodiode of an indirect conversion type formed of amorphous silicon, the conversion element (S11) may be formed of a so-called direct-conversion photodiode without including the scintillator layer 24. When the conversion element (S11) is formed of the direct-conversion photodiode, X-rays are directly converted to electric charges. In this case, the photodiode mainly uses amorphous selenium, gallium arsenide, gallium phosphide, lead iodide, mercuric iodide, CdTe or CdZnTe.

Although the switch element (T11) illustrated in FIG. 7 is formed of amorphous silicon, the switch element (T11) is not limited to this silicon in the present embodiment, but it may be formed of poly-silicon or a suitable organic material.

According to the X-ray imaging apparatus of the first embodiment, an output image with a satisfactory image quality can be obtained irrespective of the dosage of the X-rays (radiation) incident on the flat panel detector 110. It is enabled both to reduce the dosage of exposure of the object 300 to radiation and to obtain an output image with a satisfactory image quality particularly in the X-ray imaging apparatus for performing fluoroscopy for medical diagnosis or operation.

Second Embodiment

The second embodiment of the present invention is described below with reference to the accompanied drawings.

Figure 8:
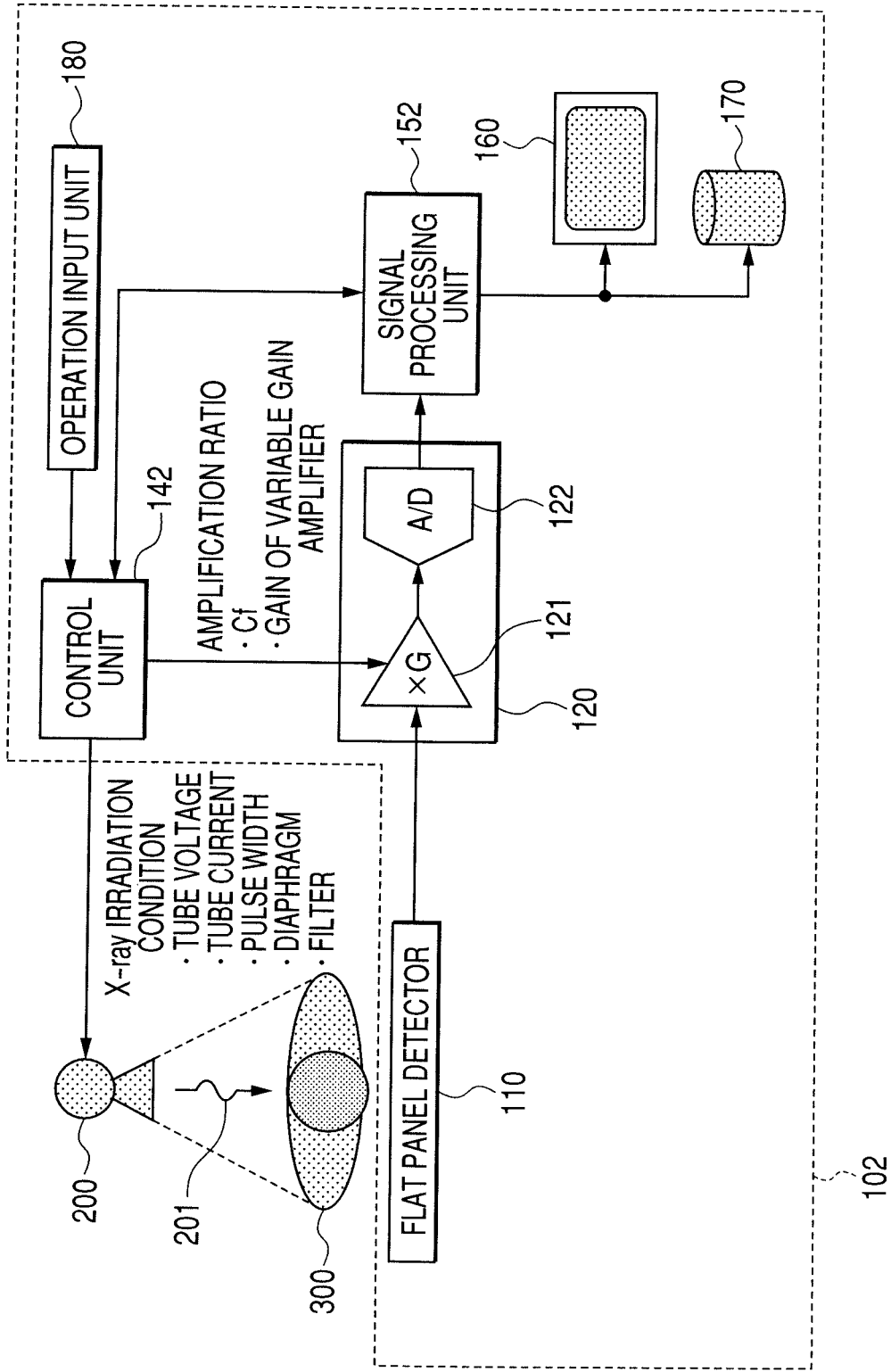
FIG. 8 is a schematic diagram of an X-ray imaging system (radiation imaging system) according to a second embodiment.

FIG. 8 is a schematic diagram of the X-ray imaging system (radiation imaging system) according to the second embodiment. In FIG. 8, the same composing elements as those in FIG. 4 according to the first embodiment are designated by the same reference numerals and characters and the detailed description thereof is omitted.

The X-ray imaging apparatus 102 of the second embodiment is different from the X-ray imaging apparatus 100 of the first embodiment in the following points:

the dosage monitor 130 is not included which monitors X-ray dosage in the target area in which the radiographer is interested; and a signal processing unit 152 processes the image signal output from the flat panel detector 110 to monitor the dosage of the X-rays incident on the target area on the flat panel detector 110. The control unit 142 determines and controls the X-ray dosage by controlling the X-ray irradiation condition of the X-ray generation apparatus 200 and the amplification ratio of the reading unit 120.

A method of driving the X-ray imaging apparatus 102 according to the second embodiment is described below.

As is the case with the first embodiment, the object 300 is irradiated with the X-rays 201 from the X-ray generation apparatus 200 under the predetermined X-ray irradiation condition. The X-rays penetrating through the object 300 are incident on the flat panel detector 110. The flat panel detector 110 detects the X-rays penetrating through the object 300 as an image signal.

The image signal detected by the flat panel detector 110 is read out by the reading unit 120 as an image signal of one frame and output to the signal processing unit 152. The signal processing unit 152 calculates the X-ray dosage in the target area from the output of the image signal in the target area and the amplification ratio of the reading unit 120 based upon the control of the control unit 142 and outputs it to the control unit 142 as an X-ray dosage signal.

The control unit 142 determines and controls X-ray dosage by controlling the X-ray irradiation condition of the X-ray generation apparatus 200 and the amplification ratio of the reading unit 120 based on the X-ray dosage signal from the signal processing unit 152 using a lookup table or calculating unit.

A driving method other than those above is the same as in the first embodiment, so that a detailed description thereof is omitted here.

Incidentally, also in the second embodiment, the operation input unit 180 is provided by which a radiographer can set required S/N ratio (that is, required image quality) by the operation input unit 180, as is the case with the first embodiment. In this case, the control unit 142 determines the X-ray dosage by controlling the X-ray irradiation condition of the X-ray generation apparatus 200 and the amplification ratio of the reading unit 120 based upon the X-ray dosage signal from the signal processing unit 152 and information on the required S/N ratio (required image quality) from the operation input unit 180 to perform control.

According to the X-ray imaging apparatus of the second embodiment, it is enabled not only to obtain the same effect as in the first embodiment, but to simplify the configuration of the X-ray imaging apparatus.

Third Embodiment

The third embodiment of the present invention is described below with reference to the accompanied drawings.

The X-ray imaging system (radiation imaging system) of the third embodiment is the same in configuration as the X-ray imaging system of the first embodiment illustrated in FIG. 4 or the X-ray imaging system of the second embodiment illustrated in FIG. 8.

Figure 9:
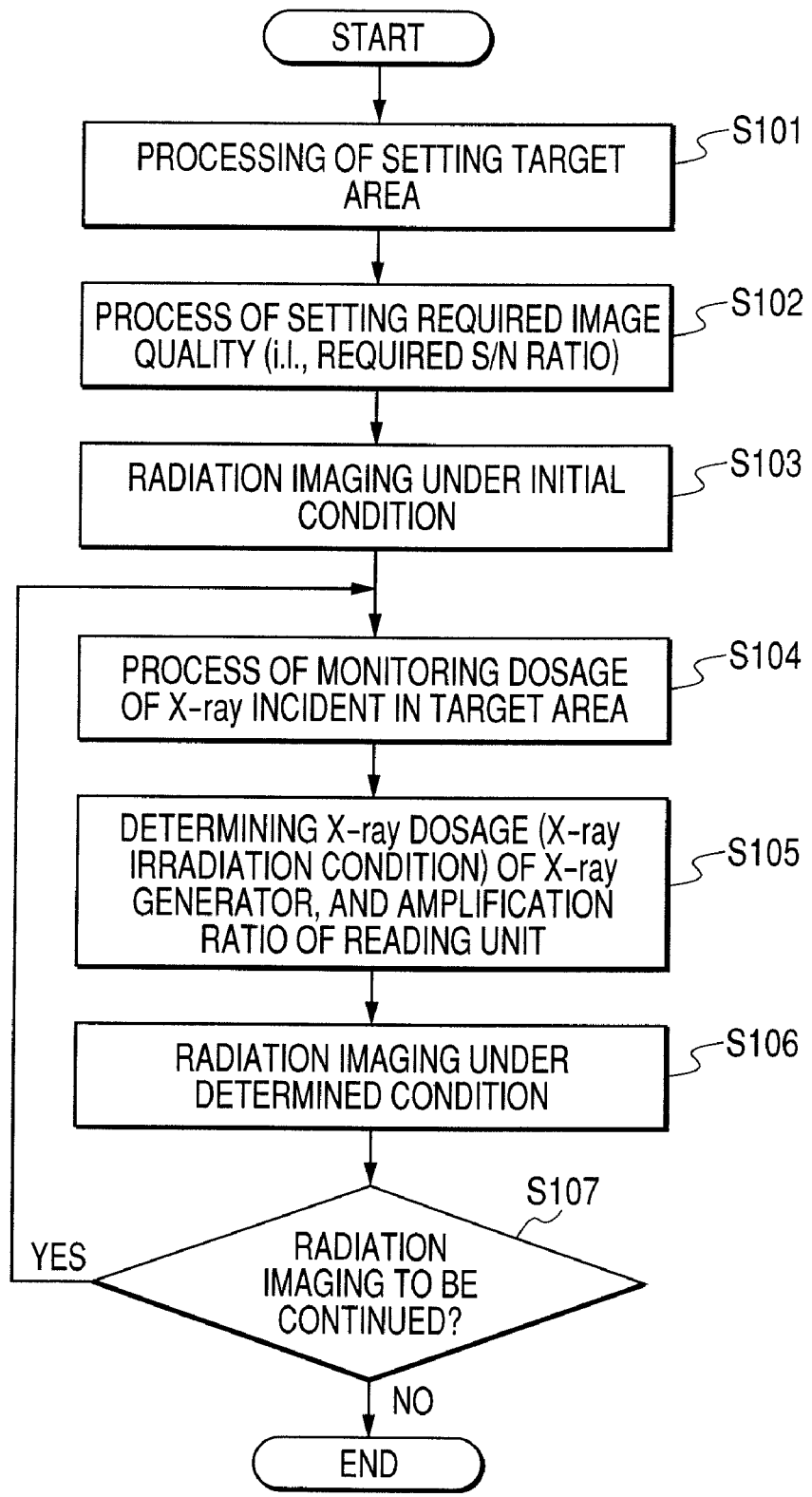
FIG. 9 is a flow chart illustrating a method of driving the X-ray imaging apparatus (radiation imaging apparatus) according to a third embodiment.

FIG. 9 is a flow chart illustrating a method of driving the X-ray imaging apparatus (radiation imaging apparatus) according to the third embodiment. In the third embodiment, a radiographer inputs and sets the target area and the required S/N ratio (required image quality) in advance through the operation input unit 180 before the object 300 is irradiated with X-rays. The process in the flow chart illustrated in FIG. 9 is performed based on the control of the control unit 140 (control unit 142), for example.

When an imaging process starts, a step S101 performs processing of setting a target area such as the heart or a specific blood vessel input by the radiographer through the operation input unit 180 (target area setting unit).

Figures 10A, 10B:
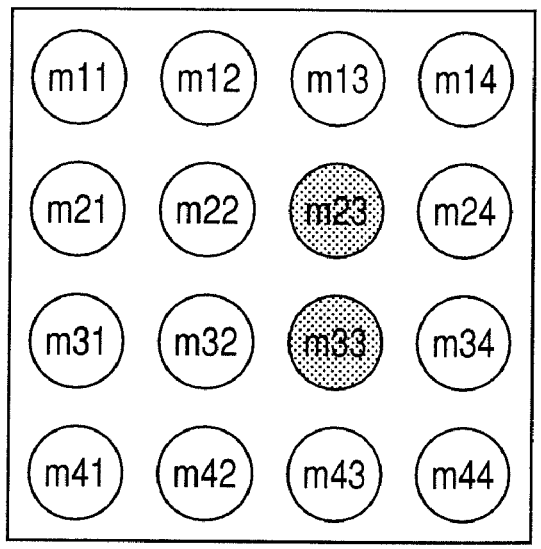
FIGS. 10A and 10B are schematic diagrams illustrating a method of setting a target area at step S101.

FIGS. 10A and 10B are schematic diagrams illustrating a method of setting the target area at step S101. The target area is set in such a manner that the screen illustrated in FIGS. 10A and 10B, for example, is displayed on the display unit 160 and the radiographer selects and determines the target area through the operation input unit 180.

FIG. 10A illustrates a chart used for setting the target area in the X-ray imaging apparatus 100 according to the first embodiment using the dosage monitor 130. In this case, the radiographer selects X-ray dosage monitors (m23 and m33) corresponding to the target areas out of a plurality of the X-ray monitors (m11 to m44). On the other hand, FIG. 10B illustrates a chart used for setting the target area in the X-ray imaging apparatus 102 according to the second embodiment in which an imaging area of the flat panel detector 110 is designated. In this case, the radiographer selects detection areas (Area 23 to Area 33) corresponding to the target areas out of a plurality of the detection areas (Area 11 to Area 44).

At step S102, the radiographer sets the required S/N ratio (that is, required image quality) input through the operation input unit 180. Incidentally, the S/N ratio setting unit in the present invention corresponds to the operation input unit 180 in the present invention, however, the S/N ratio setting unit is not limited to the above in the present invention. The S/N ratio may be set by selecting modes: mode 1=S/N ratio 10; and mode 2=S/N 100, for example. Alternatively, the S/N ratio may be set in association with imaging portions or fluoroscopic frame rate: heart section=S/N ratio 10; and limb section=S/N ratio 100, for example.

At step S103, an imaging process of one frame is performed under an initial condition, that is, under the conditions such as the X-ray dosage based on the predetermined X-ray irradiation condition and the amplification ratio of the reading unit 120.

At step S104, a monitor process is conducted in which the dosage of the X-rays incident on the target area set at step S101 is detected (calculated).

Figure 11A:
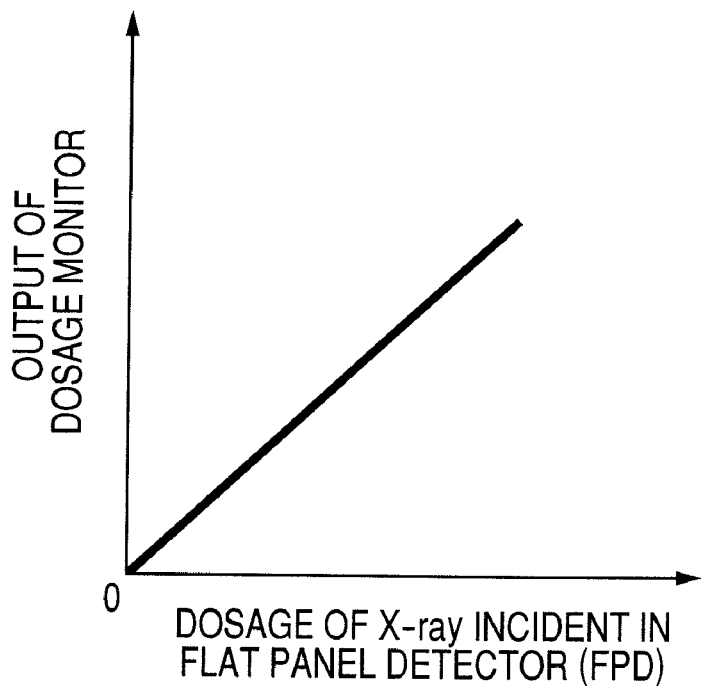
FIGS. 11A and 11B are characteristic charts used for detecting the dosage of the X-rays incident on the target area at step S104.
Figure 11B:
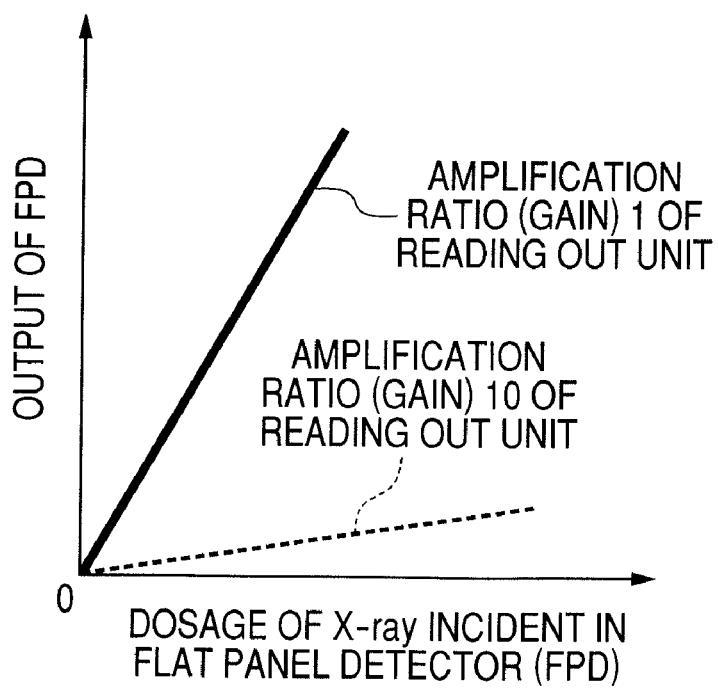

FIGS. 11A and 11B are characteristic charts used for detecting the dosage of the X-rays incident on the target area at step S104. FIG. 11A illustrates a characteristic chart in the first embodiment in which the target area is set using the dosage monitor 130. FIG. 11B illustrates a characteristic chart in the second embodiment in which the imaging area of the flat panel detector 110 is designated to set the target area.

In the X-ray imaging apparatus 100 according to the first embodiment, the dosage of the X-rays incident on the target area of the flat panel detector 110 is detected (calculated) based on information on the X-ray dosage in the target area detected by the dosage monitor 130 using the characteristic chart illustrated in FIG. 11A.

On the other hand, in the X-ray imaging apparatus 102 according to the second embodiment, the dosage of the X-rays incident on the target area is detected (calculated) based on the image signal of the flat panel detector 110 in the target area and the predetermined amplification ratio of the reading unit 120 using the characteristic chart illustrated in FIG. 11B.

At a step S105, the dosage of the X-rays 201 irradiated from the X-ray generation apparatus 200 and the amplification ratio of the reading unit 120 are determined from information on the required S/N ratio (required image quality) set at the step S102 and the X-ray dosage in the target area detected at the step 104. In addition, the X-ray irradiation condition of the X-ray generation apparatus 200 is determined from the determined dosage of the X-rays 201 irradiated from the X-ray generation apparatus 200. Incidentally, a method of determining the dosage of the X-rays irradiated from the X-ray generation apparatus 200 and the amplification ratio of the reading unit 120 at the step S105 is described in detail later.

At a step S106, the conditions (or, the X-ray irradiation condition of the X-ray generation apparatus 200 and the amplification ratio of the reading unit 120) determined at the step S105 are set to perform radiation imaging using the flat panel detector 110.

At a step S107, a determination is made as to whether radiation imaging is continued. The determination is made based on whether the radiographer performs an input operation of finishing the radiation imaging through the operation input unit 180.

As a result of the determination at the step S107, if the radiation imaging is continued, the process returns to the step S104. If the radiation imaging is not continued (or, the radiation imaging is finished), the process of the flow chart is terminated.

Concrete examples of the method of determining the dosage of the X-rays irradiated from the X-ray generation apparatus 200 and the amplification ratio of the reading unit 120 at the step S105 is described below.

Figure 13:
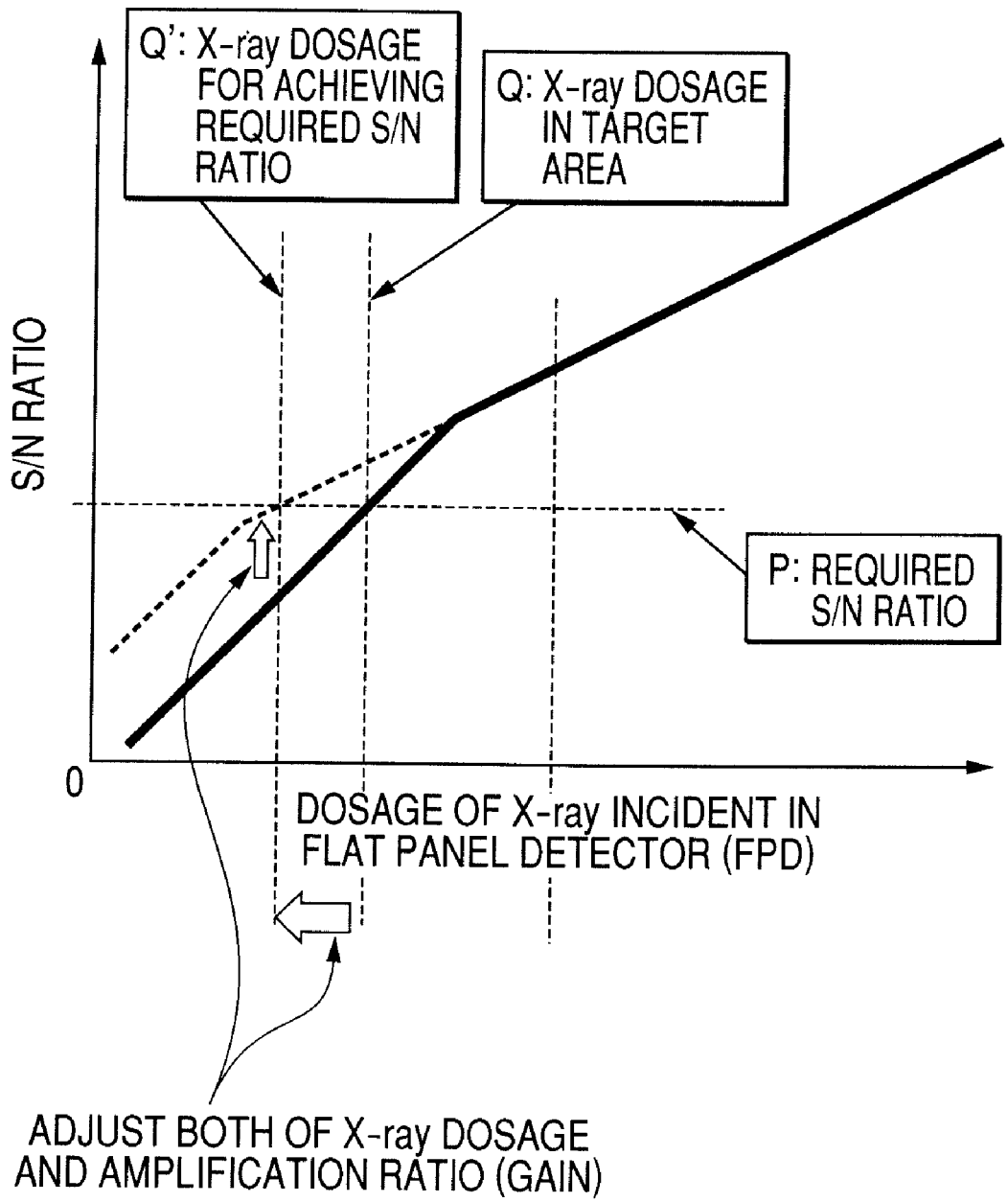
FIG. 13 is a schematic diagram illustrating one example of a method of determining the dosage of the X-rays irradiated from the X-ray generation apparatus and the amplification ratio of the reading unit at step S105.
Figure 14:
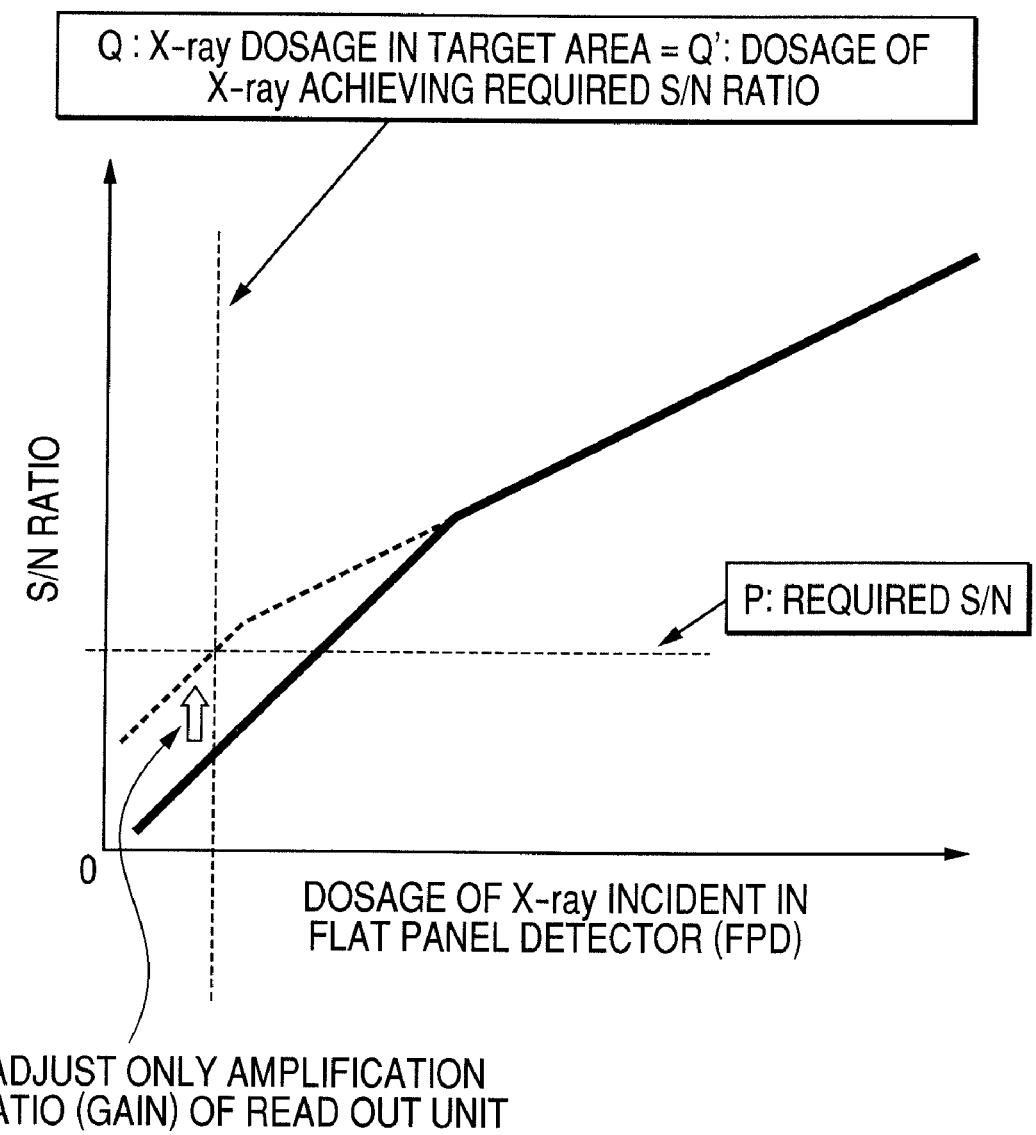
FIG. 14 is a schematic diagram illustrating one example of a method of determining the dosage of the X-rays irradiated from the X-ray generation apparatus and the amplification ratio of the reading unit at step S105.

FIGS. 12 to 14 are schematic graphs each illustrating one example of the method of determining the dosage of the X-rays irradiated from the X-ray generation apparatus 200 and the amplification ratio of the reading unit 120 at the step S105. As is the case with FIG. 3, FIGS. 12 to 14 illustrate a relationship between the dosage of the X-rays incident on the flat panel detector 110 and the S/N ratio of the entire X-ray imaging apparatus. In FIGS. 12 to 14, as one example, the S/N ratio is indicated by a solid line in the case where the amplification ratio (gain) of the reading unit 120 is one (1) and the S/N ratio is also indicated by a broken line in the case where the amplification ratio (gain) of the reading unit 120 is 10.

The example in FIG. 12 is described first. In FIG. 12, the required S/N ratio set at the step S102 is indicated by "P," and the dosage of the X-rays in the target area determined in the step S104 is indicated by "Q." FIG. 12 shows the example where the dosage Q of the X-rays in the target area determined at the step S104 is lower than the dosage Q' of the X-rays at which the required S/N ratio P set at the step S102 is achieved in the range of the amplification ratio (gain) of the reading unit 120 of from one (1) to 10. This example also represents that the dosage Q' of the X-rays at which the required S/N ratio P is achieved exists in the area of a high X-ray dosage where the X-ray quantum noise σq is dominant over the system noise σs.

In this case, the dosage of the X-rays irradiated from the X-ray generation apparatus 200 is determined so that the dosage of the X-rays incident on the flat panel detector 110 is equal to the dosage Q' to achieve the required S/N ratio P. After that, the X-ray irradiation condition of the X-ray generation apparatus 200 is determined. That is to say, the example shown in FIG. 12 controls the dosage of the X-rays irradiated from the X-ray generation apparatus 200 to increase it. At this point, the amplification ratio of the reading unit 120 does not affect the S/N ratio, so that the amplification ratio is not adjusted or determined to be one (1), (that is, to be low) with dynamic range taken into account.

In the next place, the example in FIG. 13 is described. FIG. 13 shows the example where the dosage Q of the X-rays in the target area determined at the step S104 is higher than the dosage Q' of the X-rays at which the required S/N ratio set at the step S102 is achieved, with respect to the amplification ratio of 10 out of the amplification ratio (gain) of the reading unit 120 of one (1) to 10. This example also represents that the dosage Q' of the X-rays at which the required S/N ratio P is achieved exists in the area where the dosage of X-rays is comparatively low and the S/N ratio depends both on the X-ray dosage and on the amplification ratio of the reading unit 120.

In this case, the dosage of the X-rays irradiated from the X-ray generation apparatus 200 is determined so that the dosage of the X-rays incident on the flat panel detector 110 is equal to the dosage Q' to achieve the required S/N ratio P. After that, the X-ray irradiation condition of the X-ray generation apparatus 200 is determined. Specifically, the dosage of the X-rays irradiated from the X-ray generation apparatus 200 is decreased and the amplification ratio of the reading unit 120 is determined to be 10 so that the dosage of the X-rays incident on the flat panel detector 110 is equal to the dosage Q'.

In the next place, the example in FIG. 14 is described. FIG. 14 shows the example where the dosage Q of the X-rays in the target area determined at the step S104 is equal to the dosage Q' of the X-rays at which the required S/N ratio set at the step S102 is achieved, with respect to the amplification ratio of 10 out of the amplification ratio (gain) of the reading unit 120 of one (1) to 10. This example also represents that the dosage Q' of the X-rays at which the required S/N ratio is achieved exists in the area of a low X-ray dosage where the system noise σs is dominant over the X-ray quantum noise σq.

In this case, the dosage of the X-rays irradiated from the X-ray generation apparatus 200 does not need adjusting to achieve the required S/N ratio P, but only needs determining the amplification ratio of the reading unit 120 (or the amplification ratio is determined to be 10).

Although the dosage of X-rays irradiated from the X-ray generation apparatus 200 and the amplification ratio of the reading unit 120 are determined from the characteristic charts in FIGS. 12 to 14, the required S/N ratio and the dosage of the X-rays incident on the flat panel detector 110, the present embodiment is not limited to those. For example, calculation processing using a lookup table or a mathematical formula may be used instead of the characteristic charts illustrated in FIGS. 12 to 14.

As stated above, the method of driving the X-ray imaging apparatus according to the third embodiment has the following advantages.

The dosage of X-rays 201 irradiated from the X-ray generation apparatus 200 and the amplification ratio of the reading unit 120 are determined based upon the required S/N ratio (required image quality) set at the step S102 and the X-ray dosage in the target area detected at a step 104, and the next X-ray fluoroscopic imaging is conducted.

The size of the target area set at step S101 can be adjustably set. The target area does not always need to be continuous, but can be separated into plural places. The required S/N ratio (required image quality) set at the step S102 may be adjusted on a irregular basis during the radiation imaging of a moving picture. For the dosage of X-rays to be processed with the monitor at step S104, the dosage of X-rays in the target area set at step S101 may be subjected to processing such as average, peak extraction and weighting.

Although the process at the step S105 is performed on a frame basis and the radiation imaging is carried out under the determined condition, the process may be performed once per plural frames, for example. In particular, when a fluoroscopic frame rate is high and an image processing rate speed is unsatisfactorily slow, the dosage of the X-rays irradiated from the X-ray generation apparatus 200 is widely dispersed and the object 300 is less moved, the process at the step S105 may be performed once per plural frames. A detector for detecting change in movement of the object 300 may be provided to perform the process of the step S105 when any change is made in the object 300.

In the present embodiment, the dosage of X-rays irradiated from the X-ray generation apparatus 200 (the X-ray irradiation condition of the X-ray generation apparatus 200) and the amplification ratio of the reading unit 120 are determined at the step S105 from the required S/N ratio and the dosage of the X-rays in the target area. Setting the amplification ratio of the reading unit 120 excessively high improves the S/N ratio in an image which is high in contrast, however, may lose the portions of image signals in excess of a dynamic range. In such a case, the amplification ratio of the reading unit 120 and the dosage of X-rays irradiated from the X-ray generation apparatus 200 are determined at the process of the step S105 in consideration of the dynamic range characteristics of the reading unit 120 and the flat panel detector 110.

According to the X-ray imaging apparatus according to the third embodiment, it is enabled to obtain an output image with a satisfactory image quality irrespective of the dosage of the X-rays (radiation) incident on the flat panel detector 110. It is enabled both to reduce the dosage of exposure of the object 300 to radiation and to obtain an output image with a satisfactory image quality particularly in the X-ray imaging apparatus for performing fluoroscopy for medical diagnosis or operation.

Fourth Embodiment

The fourth embodiment of the present invention is described below with reference to the accompanied drawings.

The X-ray imaging system (radiation imaging system) of the fourth embodiment is the same in configuration as the X-ray imaging system of the first embodiment illustrated in FIG. 4 or the X-ray imaging system of the second embodiment illustrated in FIG. 8.

Figure 15:
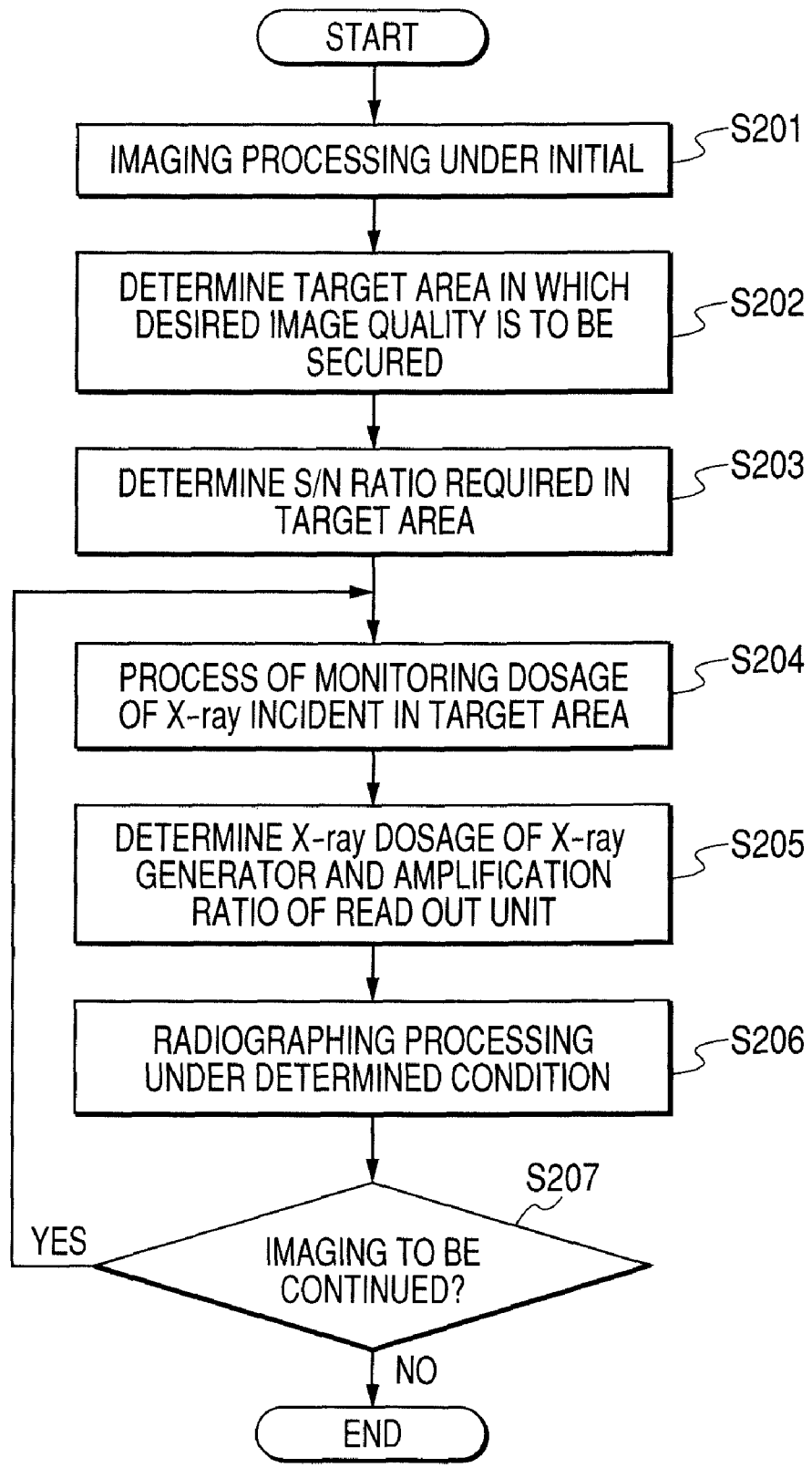
FIG. 15 is a flow chart illustrating a method of driving the X-ray imaging apparatus (radiation imaging apparatus) according to a fourth embodiment.

FIG. 15 is a flow chart illustrating a method of driving the X-ray imaging apparatus (radiation imaging apparatus) according to the fourth embodiment. The method of driving the X-ray imaging apparatus according to the fourth embodiment is different from that of the X-ray imaging apparatus according to the third embodiment illustrated in FIG. 9 in the following points.

The object 300 is irradiated with weak X-rays 201 to perform pre-radiation imaging. At this point, the obtained image signal from the flat panel detector 110 is used to perform at least any one of the following: (1) the determination of the target area where image quality is ensured; (2) the determination of the required S/N ratio; and (3) the monitor of the dosage of X-rays incident on the flat panel detector 110. The following is a description of FIG. 15 illustrating one example thereof.

When radiation imaging starts, at a step S201, the above pre-radiation imaging is conducted under an initial condition, that is, under the conditions such as the X-ray dosage based on the predetermined X-ray irradiation condition and the amplification ratio of the reading unit 120 and the image processing of one frame is performed.

At a step S202, the target area where image quality is ensured such as the heart or specific blood vessels is set (target area setting unit). At this point, the image signal obtained at the step S201 may be used to automatically set the target area, or the area input by the radiographer through the operation input unit 180 may be set as the target area.

Figure 16A:
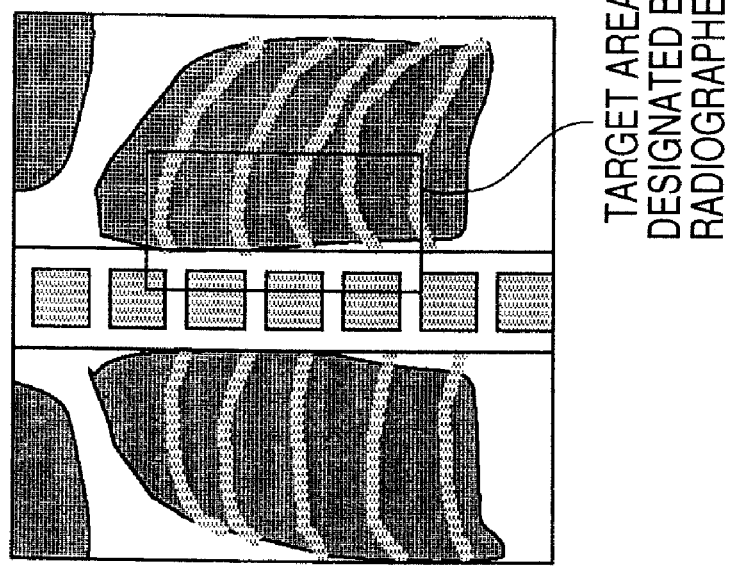
FIGS. 16A and 16B are schematic diagrams illustrating a method of setting the target area by a radiographer.
Figure 16B:
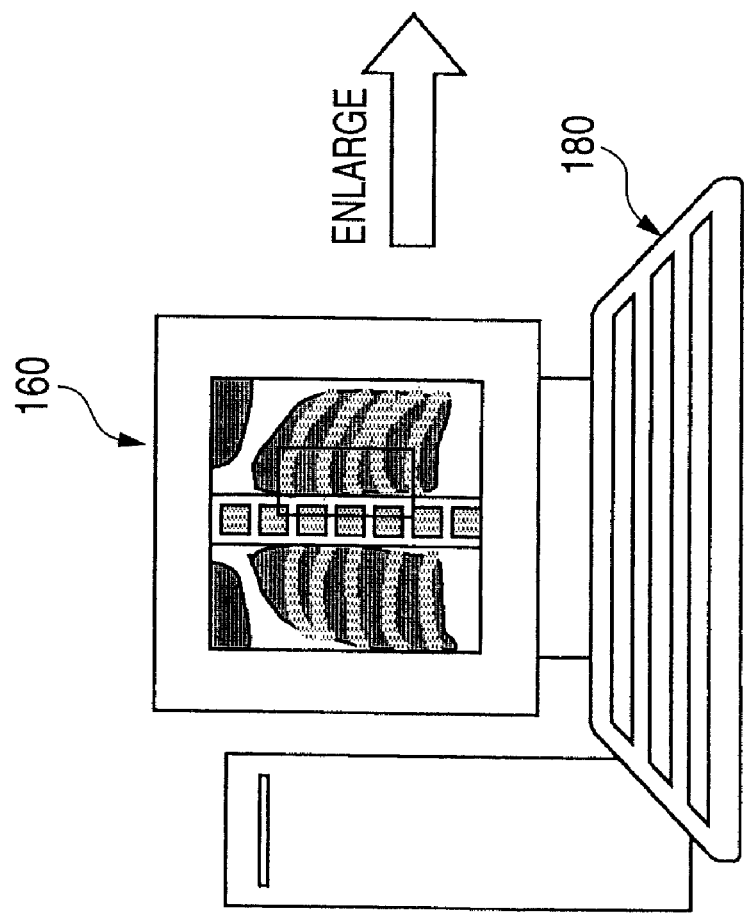

FIGS. 16A and 16B are schematic diagrams illustrating a method of setting the target area by a radiographer. FIG. 16A illustrates the display unit 160 on which an image is displayed based on the image signal obtained at the step S201, which shows that the radiographer selects and determines the target area by using the operation input unit 180, to set the target area. FIG. 16B is an enlarged view of the display screen of the display unit 160.

At a step S203, the required S/N ratio (or required image quality) is set to the target area which is set at the step S202 (S/N ratio setting unit). At this point, the required S/N ratio may be automatically set according to the target area set at the step S202 or based on the required S/N ratio (or required image quality) which the radiographer inputs with reference to the display image on the display unit 160 by using the operation input unit 180.

When the required S/N ratio (or required image quality) is automatically set, the required S/N ratio is set beforehand correspondingly with the target area: for example, a heart section=S/N ratio 10; and a limb section=S/N ratio 100. Then, the required S/N ratio is determined and set according to the set target area.

At a step S204, a monitor process is performed in which the dosage of X-rays incident on the target area set at the step S202 is detected (calculated). In this point, a monitor process may be performed in which the dosage of X-rays in the target area is automatically detected at the time of setting the target area at the step S202.

Subsequently, at a step S205, the dosage of the X-rays 201 irradiated from the X-ray generation apparatus 200 and the amplification ratio of the reading unit 120 are determined from information on the required S/N ratio (or required image quality) set at the step S203 and the dosage of X-rays in the target area detected at the step S204. Furthermore, the X-ray irradiation condition in the X-ray generation apparatus 200 is determined from the determined dosage of the X-rays 201 irradiated from the X-ray generation apparatus 200. This process is the same as that at the step S105 in FIG. 9 according to the third embodiment.

At a step S206, conditions such as the X-ray irradiation condition of the X-ray generation apparatus 200 and the amplification ratio of the reading unit 120 determined at the step S205 are set to perform radiographing processing using the flat panel detector 110.

At a step S207, a determination is made as to whether radiation imaging is continued. The determination is made based on whether the radiographer performs an input operation of finishing radiation imaging through the operation input unit 180.

As a result of the determination at the step S207, if the radiation imaging is continued, the process returns to the step S204. If the radiation imaging is not continued (or, the radiation imaging is finished), the process of the flow chart is terminated.

According to the X-ray imaging apparatus of the fourth embodiment, automatically setting the target area and the required S/N ratio based on information on the image signal obtained from the pre-radiation imaging enables reducing operational burden to the radiographer as well as producing the same effect as in the third embodiment (the first embodiment).

Fifth Embodiment

The fifth embodiment of the present invention is described below with reference to the accompanied drawings.

Figure 17:
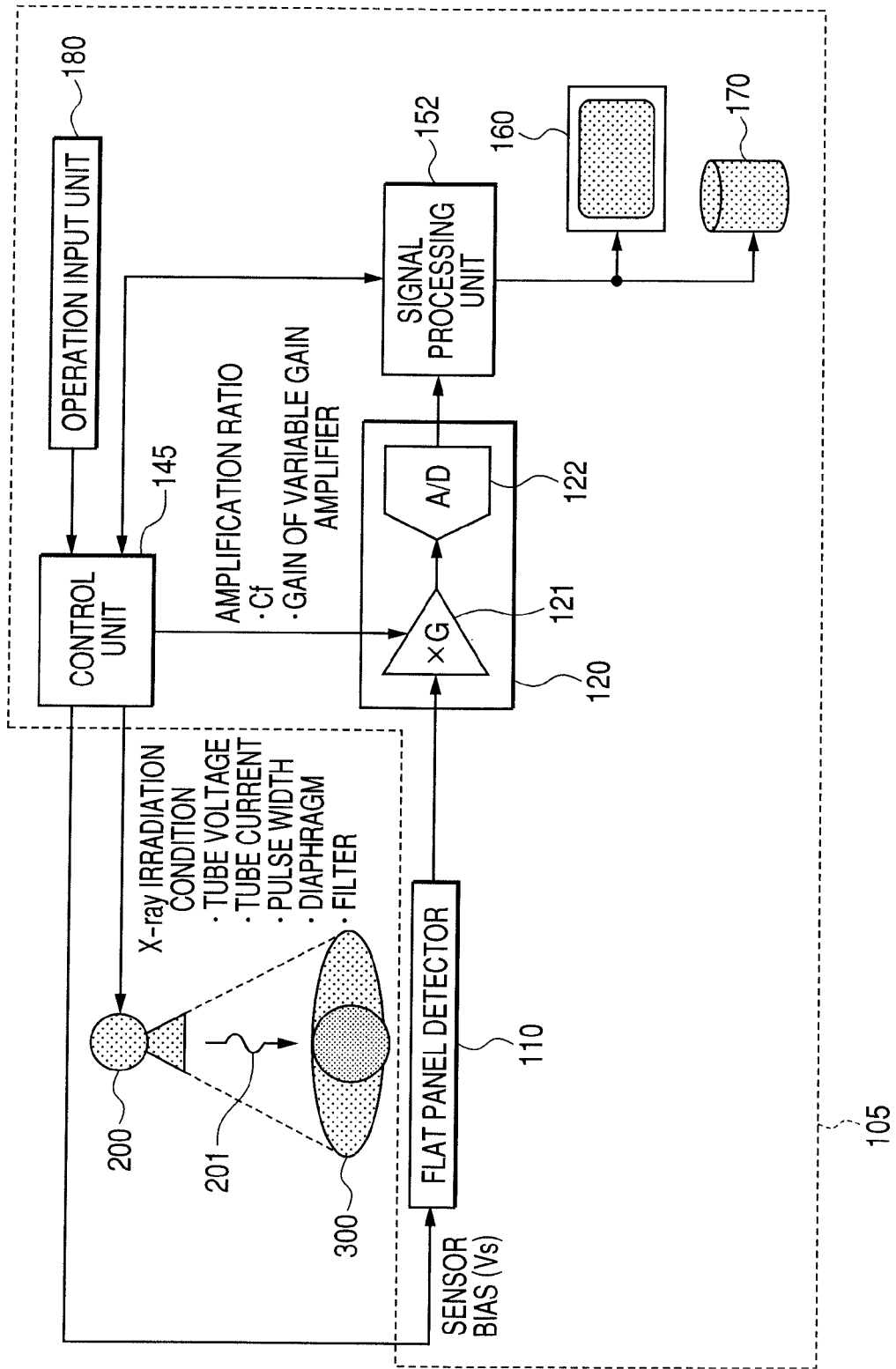
FIG. 17 is a schematic diagram of an X-ray imaging system (radiation imaging system) according to a fifth embodiment.

FIG. 17 is a schematic diagram of an X-ray imaging system (radiation imaging system) according to the fifth embodiment. In FIG. 17, the same composing elements as those in FIG. 8 according to the second embodiment are designated by the same reference numerals and characters and the detailed description thereof is omitted.

The X-ray imaging system of the fifth embodiment is different from the X-ray imaging system of the second embodiment illustrated in FIG. 8 in that the control unit 145 controls the sensor bias Vs of the flat panel detector 110 as well as the amplification ratio of the reading unit 120 and the dosage of the X-rays from the X-ray generation apparatus 200 (X-ray irradiation condition).

Figure 18:
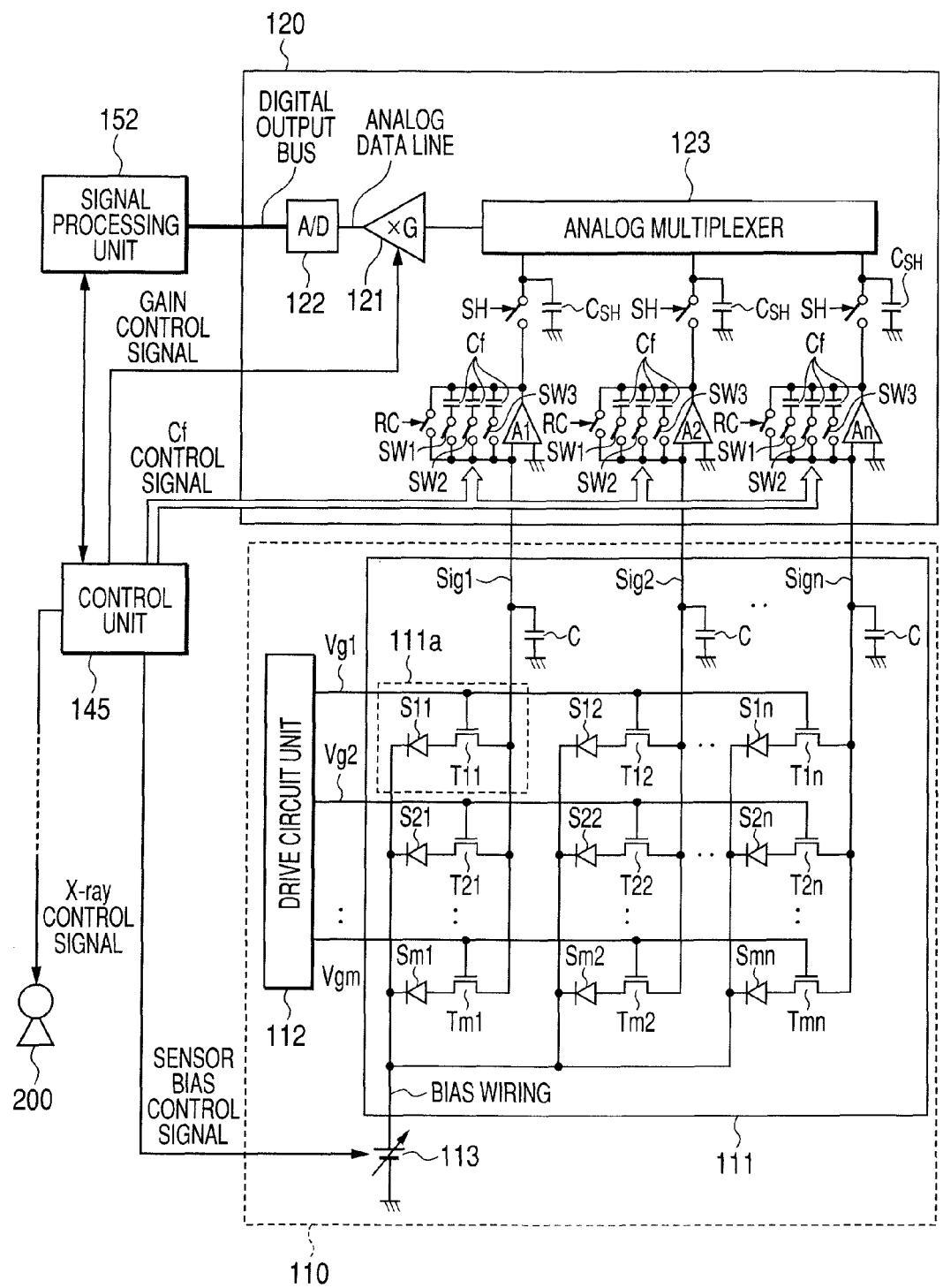
FIG. 18 is a schematic diagram illustrating a detailed circuit configuration of a flat panel detector and a reading unit in the X-ray imaging apparatus (radiation imaging apparatus) according to the fifth embodiment.

FIG. 18 is a schematic diagram of a detailed circuit configuration of the flat panel detector 110 and the reading unit 120 in the X-ray imaging apparatus (radiation imaging apparatus) 105 according to the fifth embodiment. In FIG. 18, the same composing elements as those in FIG. 5 according to the first embodiment are designated by the same reference numerals and characters and the detailed description thereof is omitted.

Specifically, as illustrated in FIG. 18, the control unit 145 is capable of controlling the electric potential (voltage) of sensor bias of the bias (Vs) power supply 113.

Figure 19:
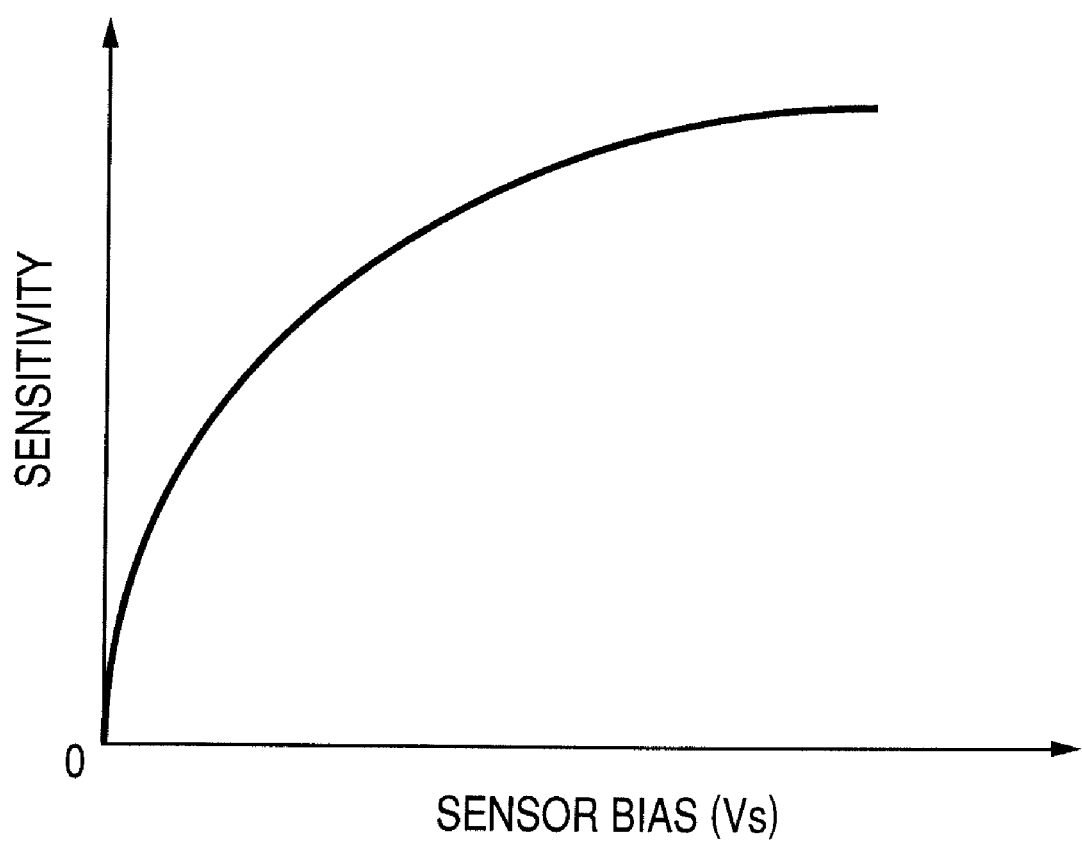
FIG. 19 is a characteristic curve illustrating a relationship between the sensitivity and the sensor bias (Vs) of the flat panel detector.

FIG. 19 is a characteristic curve illustrating a relationship between the sensitivity and the sensor bias (Vs) of the flat panel detector 110.

As can be seen from FIG. 19, the sensitivity of the flat panel detector 110 depends on the sensor bias (Vs). In other words, the gain of the flat panel detector 110 depends on the sensor bias (Vs), which produces the same effect as would be caused by adjusting the feedback capacitors (integrating capacitors) Cf of the reading unit 120 and the gain of the variable gain amplifier 121. In this case, the sensor bias (Vs) may be controlled by switching a plurality of power supplies with a switch or by using one power supply capable of continuously controlling electric potential (voltage).

It is more preferable, particularly as in FIG. 12 (FIG. 13), that the control unit 145 be capable of controlling the feedback capacitors Cf of the reading unit 120 and the gain of the variable gain amplifier 121 as well as the sensor bias (Vs) from the viewpoint of more accurately controlling the amplification ratio of the reading unit 120.

The sensitivity of the flat panel detector 110 illustrated in FIG. 19 particularly depends on the sensor bias (Vs) when the conversion element (S11 to Smn) is formed of a direct-conversion photoelectric conversion element such as amorphous selenium, gallium arsenide, gallium phosphide, lead iodide, mercuric iodide, CdTe or CdZnTe. In such a case, it is more desirable to vary the sensor bias (Vs) to control the amplification ratio of the reading unit 120.

According to the X-ray generation apparatus 200 of the fifth embodiment, not only the dosage of the X-rays from the X-ray generation apparatus 200 and the amplification ratio of the reading unit 120, but also the bias applied to the conversion elements is controlled. This enables providing an output image with a high image quality as well as the same effect as the second embodiment (the first embodiment).

The steps in FIGS. 9 and 15 illustrating the method of driving the X-ray imaging apparatus according to the above embodiments can be realized by operating programs stored in a RAM or a ROM of a computer. The programs and a computer-readable storing medium in which the programs are stored are included in the present invention.

Specifically, the programs are stored in such a storing medium as, for example, a CD-ROM or supplied to a computer through various transmission media. Not only a CD-ROM, but also a flexible disk, a hard disk, a magnetic tape, a magneto-optic disk or nonvolatile memory card may be used as a storing medium for storing the programs. On the other hand, a communication medium in the system of computer network such as LAN, WAN for the Internet and radio communication network for transmitting the program information as a carrier to supply it can be used as a transmission medium for the programs. The transmission medium in this case includes a wire circuit such as an optical fiber or a wireless circuit.

The programs concerned with to the present invention are not limited to those for realizing the functions of the X-ray imaging apparatus according to the embodiments by the computer executing the supplied program, but those for realizing the functions of the X-ray imaging apparatus according to the embodiments by the program collaborating with an operating system (OS) operating in a computer or other application software or by a feature expansion board or a feature expansion unit of the computer processing all or part of the supplied programs.

Incidentally, the above embodiments have been merely shown as examples of embodying the invention and are not to be construed to limit the technical scope of the present invention. That is to say, the present invention may be made in various ways without departing from the technical sprit and essential features of the invention.

Industrial Applicability

The present invention is suitably used for a radiation imaging apparatus and a radiation imaging system usable in medical diagnosis or nondestructive inspection.

This application claims priorities from Japanese Patent Applications No. 2007-027157, filed Feb. 6, 2007, and No. 2008-011879, filed Jan. 22, 2008, which are hereby incorporated by reference herein.

The invention claimed is:

1. A radiation imaging apparatus comprising:
a detection unit for detecting as an image signal radiation that is emitted from a radiation generator has passed through an object;
a read-out unit for amplifying and reading out the image signal detected by said detection unit; and
a control unit for controlling at least one of the radiation generator, said detection unit said read-out unit to cause the image signal to have an S/N ratio required for the image signal, wherein when a radiation dosage at which the S/N ratio required for the image signal is achieved is within a first range, in which a first noise component relating to the radiation dosage is dominant among noise components in the image signal, said control unit adjusts the radiation dosage, and when the radiation dosage at which the S/N ratio required for the image signal is achieved is within a second range, in which a second noise component inherent in said detection unit or said read-out unit is dominant among noise components in the image signal, and when the radiation dosage within the second range is smaller than the radiation dosage within the first range, said control unit adjusts at least one of an amplification ratio of said detection unit and an amplification ratio of said read-out unit.

2. The radiation imaging apparatus according to claim 1, wherein said control unit adjusts the radiation dosage, and at least one of the amplification ratios of said detection unit and the amplification ratio of said read-out unit when the radiation dosage is within a third range between the first and second ranges.

3. The radiation imaging apparatus according to claim 1, wherein
said detection unit is provided with a plurality of conversion elements for converting the radiation incident therein into the image signal, and
said control unit adjusts a bias applied to said conversion elements.

4. The radiation imaging apparatus according to claim 3, wherein said conversion elements each comprise a scintillator for converting the radiation into light, and a photoelectric conversion element for converting the light into the image signal, or directly convert the radiation into the image signal.

5. The radiation imaging apparatus according to claim 1, further comprising a radiation dosage detection unit for detecting the radiation dosage incident in said detection unit, wherein
said control unit performs the controlling based on the radiation dosage detected by said radiation dosage detection unit.

6. The radiation imaging apparatus according to claim 1, further comprising a signal processing unit for calculating the radiation dosage incident in said detection unit, based on the image signal read-out by said read-out unit, wherein
said control unit performs the controlling based on the radiation dosage calculated by the detected by said signal processing unit.

7. The radiation imaging apparatus according to claim 1, further comprising a target area setting unit for setting a target area within a detection area of said detection unit,
wherein said control unit performs the controlling based on the radiation dosage incident in the target area set by said target area setting unit.

8. The radiation imaging apparatus according to claim 1, further comprising an S/N ratio setting unit for setting the S/N ratio required for the image signal.

9. The radiation imaging apparatus according to claim 1, wherein said control unit performs the controlling in relation to dynamic range characteristics of said detection unit or said read-out unit.

10. A radiation imaging system comprising:
the radiation imaging apparatus according to claim 1; and
the radiation generator.

11. The radiation imaging apparatus according to claim 1, wherein the first noise component is ½ or less of the second noise component within the first range, and the first noise component is twice or more times the second noise component within the second range.

12. The radiation imaging apparatus according to claim 11, wherein, when the radiation dosage at which the S/N ratio required for the image signal is achieved is within the first range, said control unit adjusts the radiation dosage and does not adjust the amplification ratios of said detection unit and said read-out unit.

13. A method of driving a radiation imaging apparatus that comprises a detection unit for detecting as an image signal radiation that is emitted from a radiation generator has passed through an object, and a read-out unit for amplifying and reading out the image signal detected by the detection unit, wherein said method comprises the step of:

controlling at least one of the radiation generator, the detection unit and the read-out unit to cause the image signal to have a required S/N ratio that is required for the image signal, wherein said controlling step includes adjusting a radiation dosage when the radiation dosage at which the S/N ratio required for the image signal is achieved is within a first range, in which a first noise component relating to the radiation dosage is dominant among noise components in the image signal, while adjusting at least one of an amplification ratio of the detection unit and an amplification ratio of the read-out unit when the radiation dosage at which the S/N ratio required for the image signal is achieved is within a second range, in which a second noise component inherent in the detection unit or the read-out unit is dominant among noise components in the image signal, and when the radiation dosage within the second range is smaller than the radiation dosage within the first range.

* * * * *